(12) United States Patent
Ohsawa et al.

(10) Patent No.: US 8,815,492 B2
(45) Date of Patent: Aug. 26, 2014

(54) CHEMICALLY AMPLIFIED POSITIVE RESIST COMPOSITION FOR ARF IMMERSION LITHOGRAPHY AND PATTERN FORMING PROCESS

(75) Inventors: Youichi Ohsawa, Joetsu (JP); Masaki Ohashi, Joetsu (JP); Takeshi Sasami, Joetsu (JP); Jun Hatakeyama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 84 days.

(21) Appl. No.: 13/616,523

(22) Filed: Sep. 14, 2012

(65) Prior Publication Data
US 2013/0108964 A1 May 2, 2013

(30) Foreign Application Priority Data
Oct. 26, 2011 (JP) .................................. 2011-234818

(51) Int. Cl.
G03F 7/004 (2006.01)
G03F 7/028 (2006.01)
G03F 7/039 (2006.01)
G03F 7/26 (2006.01)
G03F 7/027 (2006.01)
G03F 7/20 (2006.01)

(52) U.S. Cl.
CPC .............. *G03F 7/027* (2013.01); *G03F 7/028* (2013.01); *G03F 7/26* (2013.01); *G03F 7/039* (2013.01); *G03F 7/004* (2013.01); *G03F 7/20* (2013.01); *Y10S 430/109* (2013.01); *Y10S 430/122* (2013.01); *Y10S 430/126* (2013.01)
USPC ........ 430/270.1; 430/326; 430/908; 430/921; 430/925

(58) Field of Classification Search
USPC ........................ 430/270.1, 326, 908, 921, 925
See application file for complete search history.

(56) References Cited

U.S. PATENT DOCUMENTS

| | | | |
|---|---|---|---|
| 3,271,341 A | 9/1966 | Garrison, Jr. | |
| 5,650,483 A | 7/1997 | Malik et al. | |
| 6,312,867 B1 | 11/2001 | Kinsho et al. | |
| 6,479,210 B2 | 11/2002 | Kinoshita et al. | |
| 6,485,883 B2 | 11/2002 | Kodama et al. | |
| 6,492,091 B2 | 12/2002 | Kodama et al. | |
| 6,830,866 B2 | 12/2004 | Kobayashi et al. | |
| 7,214,467 B2 | 5/2007 | Kanna et al. | |
| 7,527,912 B2 | 5/2009 | Ohsawa et al. | |
| 7,569,326 B2 | 8/2009 | Ohsawa et al. | |
| 7,622,242 B2 | 11/2009 | Hatakeyama et al. | |
| 7,771,914 B2 | 8/2010 | Hatakeyama et al. | |
| 7,919,226 B2 | 4/2011 | Ohsawa et al. | |
| 8,057,981 B2 | 11/2011 | Harada et al. | |
| 8,057,985 B2 | 11/2011 | Ohashi et al. | |
| 8,062,828 B2 | 11/2011 | Ohsawa et al. | |
| 8,101,335 B2 | 1/2012 | Harada et al. | |
| 8,105,748 B2 | 1/2012 | Ohashi et al. | |
| 8,110,711 B2 | 2/2012 | Jodry et al. | |
| 8,114,570 B2 | 2/2012 | Ohsawa et al. | |
| 8,173,354 B2 | 5/2012 | Ohsawa et al. | |
| 8,252,504 B2 | 8/2012 | Harada et al. | |
| 8,581,009 B2* | 11/2013 | Hagiwara et al. | ............ 568/842 |
| 2009/0274978 A1 | 11/2009 | Ohashi et al. | |
| 2010/0035185 A1 | 2/2010 | Hagiwara et al. | |
| 2010/0112482 A1 | 5/2010 | Watanabe et al. | |
| 2010/0136482 A1 | 6/2010 | Harada et al. | |
| 2010/0209827 A1 | 8/2010 | Ohashi et al. | |
| 2010/0266957 A1 | 10/2010 | Harada et al. | |
| 2012/0288796 A1* | 11/2012 | Katayama et al. | ........ 430/285.1 |

FOREIGN PATENT DOCUMENTS

| | | |
|---|---|---|
| EP | 0473547 A1 | 3/1992 |
| JP | 04-230645 A | 8/1992 |
| JP | 11-295887 A | 10/1999 |
| JP | 11-327143 A | 11/1999 |
| JP | 2000-336121 A | 12/2000 |
| JP | 2003-066612 A | 3/2003 |
| JP | 2005-084365 A | 3/2005 |
| JP | 2007-145797 A | 6/2007 |
| JP | 2007-298569 A | 11/2007 |
| JP | 2008-106045 A | 5/2008 |
| JP | 2008-122932 A | 5/2008 |
| JP | 2008-133448 A | 6/2008 |
| JP | 4116340 B2 | 7/2008 |
| JP | 2009-007327 A | 1/2009 |
| JP | 4226803 B2 | 2/2009 |
| JP | 4231622 B2 | 3/2009 |
| JP | 2009-091350 A | 4/2009 |
| JP | 2009-098638 A | 5/2009 |
| JP | 2009-191151 A | 8/2009 |
| JP | 2009-192784 A | 8/2009 |
| JP | 2009-217253 A | 9/2009 |
| JP | 2009-258695 A | 11/2009 |
| JP | 2009-269953 A | 11/2009 |
| JP | 2009-276363 A | 11/2009 |
| JP | 2010-020204 A | 1/2010 |
| JP | 2010-077404 A | 4/2010 |
| JP | 2010-107695 A | 5/2010 |
| JP | 2010-116550 A | 5/2010 |
| JP | 2010-134012 A | 6/2010 |
| JP | 2010-215608 A | 9/2010 |
| JP | 2010-250105 A | 11/2010 |
| JP | 2011-016746 A | 1/2011 |
| JP | 2011-042789 A | 3/2011 |
| WO | WO2009/037981 | * 3/2009 |

* cited by examiner

*Primary Examiner* — Anca Eoff
(74) *Attorney, Agent, or Firm* — Westerman, Hattori, Daniels & Adrian, LLP

(57) ABSTRACT

A chemically amplified positive resist composition comprising (A) a triarylsulfonium salt of 2,3,3,3-tetrafluoro-2-(1,1,2,2,3,3,3-heptafluoropropoxy)propionic acid, (B) an acid generator, (C) a base resin, and (D) an organic solvent is suited for ArF immersion lithography. The sulfonium salt is highly hydrophobic and little leached out in immersion water. By virtue of controlled acid diffusion, a pattern profile with high resolution can be constructed.

6 Claims, 1 Drawing Sheet

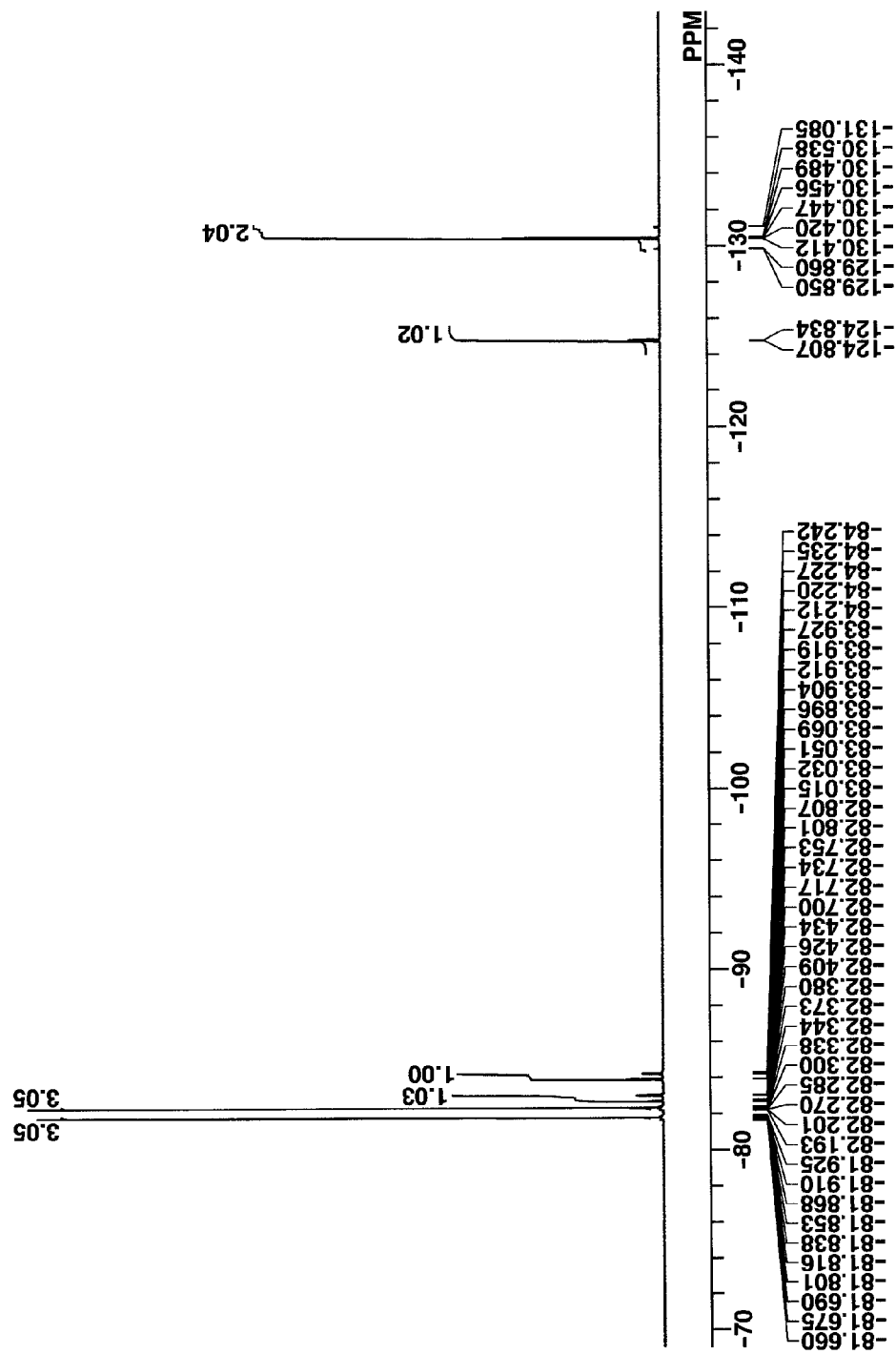

CHEMICALLY AMPLIFIED POSITIVE RESIST COMPOSITION FOR ARF IMMERSION LITHOGRAPHY AND PATTERN FORMING PROCESS

CROSS-REFERENCE TO RELATED APPLICATION

This non-provisional application claims priority under 35 U.S.C. §119(a) on Patent Application No. 2011-234818 filed in Japan on Oct. 26, 2011, the entire contents of which are hereby incorporated by reference.

TECHNICAL FIELD

This invention relates to a chemically amplified positive resist composition for ArF immersion lithography comprising a specific carboxylic acid sulfonium salt, and a pattern forming process using the resist composition.

BACKGROUND ART

While a number of recent efforts are being made to achieve a finer pattern rule in the drive for higher integration and operating speeds in LSI devices, DUV and EUV lithography is thought to hold particular promise as the next generation in microfabrication technology. In particular, photolithography using an ArF excimer laser as the light source is thought requisite to the micropatterning technique capable of achieving a feature size of 0.13 µm or less.

The ArF lithography started partial use from the fabrication of 130-nm node devices and became the main lithography since 90-nm node devices. Although lithography using $F_2$ laser (157 nm) was initially thought promising as the next lithography for 45-nm node devices, its development was retarded by several problems. A highlight was suddenly placed on the ArF immersion lithography that introduces a liquid having a higher refractive index than air (e.g., water, ethylene glycol, glycerol) between the projection lens and the wafer, allowing the projection lens to be designed to a numerical aperture (NA) of 1.0 or higher and achieving a higher resolution. While the ArF immersion lithography has entered the commercial stage, the technology still needs a resist material which is substantially non-leachable in water.

In the ArF lithography (193 nm), a high sensitivity resist material capable of achieving a high resolution at a small dose of exposure is needed to prevent the degradation of precise and expensive optical system materials. Among several measures for providing high sensitivity resist material, the most common is to select each component which is highly transparent at the wavelength of 193 nm. For example, polyacrylic acid and derivatives thereof, norbornene-maleic anhydride alternating copolymers, polynorbornene, ring-opening metathesis polymerization (ROMP) polymers, and hydrogenated ROMP polymers have been proposed as the base resin. This choice is effective to some extent in enhancing the transparency of a resin alone.

Studies have also been made on photoacid generators (PAGs) and diffusion regulators. Sulfonium salts such as triphenylsulfonium nonafluorobutanesulfonate are typically used as the PAG because of stability in resist compositions. Amines and weak acid onium salts are typically used as the diffusion regulator. JP-A H11-295887 describes that the addition of triphenylsulfonium acetate ensures to form a satisfactory resist pattern without T-top profile, a difference in line width between isolated and grouped patterns, and standing waves. JP-A H11-327143 reports improvements in sensitivity, resolution and exposure margin by the addition of sulfonic acid ammonium salt or carboxylic acid ammonium salt. Also, JP 4231622 describes that a resist composition for KrF or EB lithography comprising a PAG capable of generating a fluorinated carboxylic acid is improved in resolution and process latitude such as exposure margin and depth of focus. Further, JP 4116340 describes that a resist composition for $F_2$ laser lithography comprising a PAG capable of generating a fluorinated carboxylic acid is improved in line edge roughness (LER) and solves the footing problem. While these four patent documents refer to the KrF, EB and $F_2$ lithography, JP 4226803 describes a positive photosensitive composition for ArF excimer laser lithography comprising a carboxylic acid onium salt. These systems are based on the mechanism that a salt exchange occurs between a weak acid onium salt and a strong acid (sulfonic acid) generated by another PAG upon exposure, to form a weak acid and a strong acid onium salt. That is, the strong acid (sulfonic acid) having high acidity is replaced by a weak acid (carboxylic acid), thereby suppressing acid-aided decomposition reaction of acid labile group and reducing or controlling the distance of acid diffusion.

However, even when a weak acid onium salt is used, there still remain problems. Pattern collapse can occur, eventually achieving no improvements in resolution. Low dissolution in alkaline developer may cause defects after development. The salt component can be leached out in immersion liquid (water) to contaminate the immersion lithography tool. The LER problem is not overcome.

Citation List

Patent Document 1: JP-A H11-295887 (U.S. Pat. No. 6,479,210)

Patent Document 2: JP-A H11-327143

Patent Document 3: JP 4231622 (U.S. Pat. No. 6,485,883)

Patent Document 4: JP 4116340 (U.S. Pat. No. 7,214,467)

Patent Document 5: JP 4226803 (U.S. Pat. No. 6,492,091)

DISCLOSURE OF INVENTION

An object of the invention is to provide a chemically amplified positive resist composition for ArF immersion lithography comprising a specific carboxylic acid sulfonium salt serving as an acid diffusion control agent so that it may form a resist pattern with improved resolution and minimal defects after development, and a pattern forming process using the resist composition.

The inventors have found that a resist composition comprising a triarylsulfonium salt of 2,3,3,3-tetrafluoro-2-(1,1,2,2,3,3,3-heptafluoropropoxy)propionic acid having the general formula (1-1), shown below, as the acid diffusion control agent forms a resist film having improved resolution and minimal defects after development and is suited for high accuracy micropatterning.

In one aspect, the invention provides a chemically amplified positive resist composition for ArF immersion lithography, comprising (A) a triarylsulfonium 2,3,3,3-tetrafluoro-2-(1,1,2,2,3,3,3-heptafluoropropoxy)propionate having the general formula (1-1):

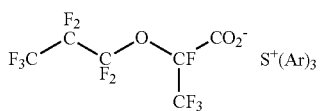
(1-1)

wherein Ar is a substituted or unsubstituted $C_6$-$C_{20}$ aryl group which may contain a heteroatom, or a plurality of Ar groups may bond together directly or via an oxygen atom, methylene, sulfone or carbonyl moiety, (B) one or more acid generator having the general formula (1-2):

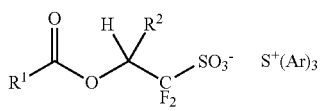
(1-2)

wherein $R^1$ is a $C_1$-$C_{30}$ alkyl, alkenyl or aralkyl group which may contain a heteroatom, $R^2$ is hydrogen or trifluoromethyl, and Ar is a substituted or unsubstituted $C_6$-$C_{20}$ aryl group which may contain a heteroatom, or a plurality of Ar groups may bond together directly or via an oxygen atom, methylene, sulfone or carbonyl moiety, (C) a base resin having an acidic functional group protected with an acid labile group, which is insoluble or substantially insoluble in alkaline developer, but turns soluble in alkaline developer upon deprotection of the acid labile group, and (D) an organic solvent.

In a preferred embodiment, the base resin (C) comprises recurring units having an acid labile group represented by the general formula (3) and recurring units of at least one type selected from the general formulae (4) to (6):

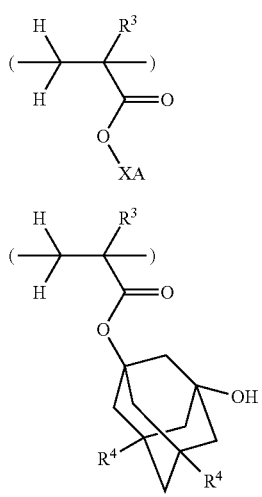

(3)

(4)

(5)

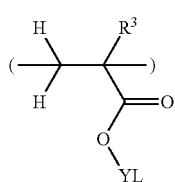
(6)

wherein $R^3$ is hydrogen, fluorine, methyl or trifluoromethyl, XA is an acid labile group, $R^4$ is each independently hydrogen or hydroxyl, YL is a substituent group having a lactone structure, ZA is hydrogen, a $C_1$-$C_{15}$ fluoroalkyl group or $C_1$-$C_{15}$ fluoroalcohol-containing substituent group.

In another aspect, the invention provides a chemically amplified positive resist composition for ArF immersion lithography, comprising (A) a triarylsulfonium 2,3,3,3-tetrafluoro-2-(1,1,2,2,3,3,3-heptafluoropropoxy)propionate having the general formula (1-1):

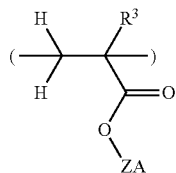
(1-1)

wherein Ar is as defined above, (B) one or more acid generator having the general formula (1-3):

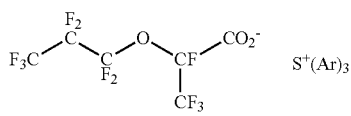
(1-3)

wherein R' is a backbone of the base resin (C), $R^2$ is hydrogen or trifluoromethyl, and Ar is as defined above, (C) a base resin having an acidic functional group protected with an acid labile group, which is insoluble or substantially insoluble in alkaline developer, but turns soluble in alkaline developer upon deprotection of the acid labile group, and (D) an organic solvent.

In a preferred embodiment, components (B) and (C) are combined as a polymer comprising acid labile group-containing recurring units having the general formula (3), recurring units of at least one type selected from the general formulae (4) to (6), and recurring units having the general formula (7).

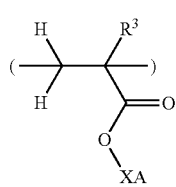
(3)

(4)

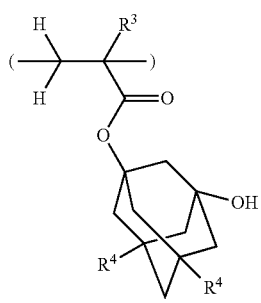

(5)

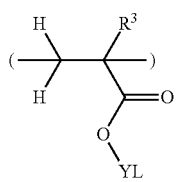

(6)

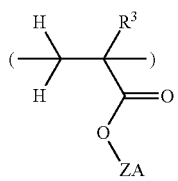

(7)

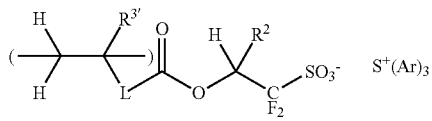

Herein $R^3$ is hydrogen, fluorine, methyl or trifluoromethyl, XA is an acid labile group, $R^4$ is each independently hydrogen or hydroxyl, YL is a substituent group having a lactone structure, ZA is hydrogen, a $C_1$-$C_{15}$ fluoroalkyl group or $C_1$-$C_{15}$ fluoroalcohol-containing substituent group, $R^{3'}$ is hydrogen or methyl, L is a single bond or a divalent hydrocarbon group which may contain an ether or ester bond, $R^2$ and Ar are as defined above.

In a preferred embodiment, the recurring unit having formula (7) is selected from the following recurring units.

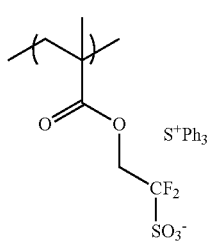

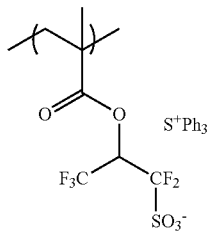

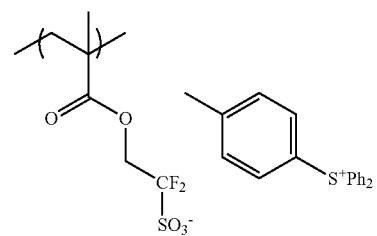

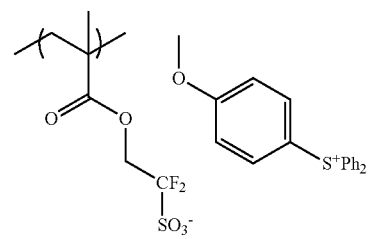

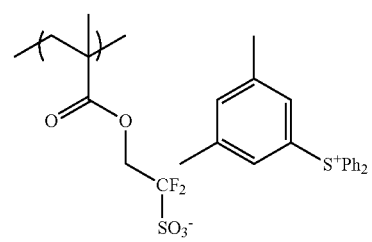

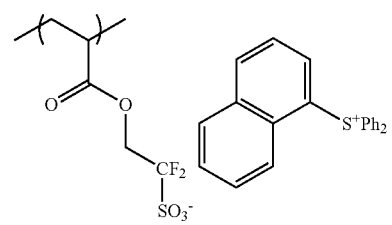

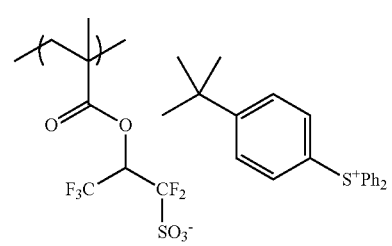

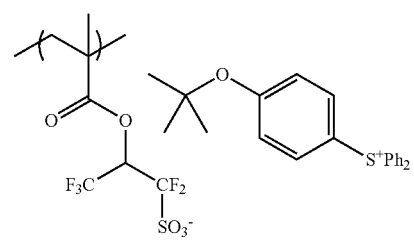

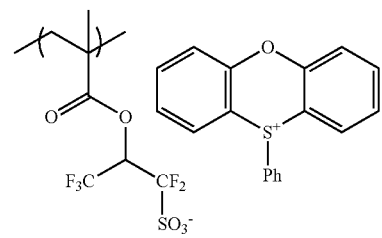

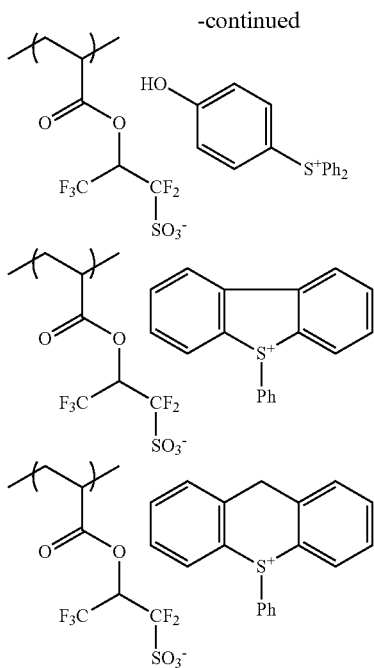

Herein Ph is phenyl.

In a further aspect, the invention provides a pattern forming process comprising the steps of applying the resist composition defined above onto a substrate, prebaking to form a resist film, exposing the resist film to high-energy radiation through a photomask while interposing water between the substrate and a projection lens, optionally baking, and developing in a developer.

It is noted that the resist composition of the invention can be applied to the immersion lithography. The immersion lithography is designed to expose the prebaked resist film to light from a projection lens with an immersion medium interposed between the resist film and the projection lens. The ArF immersion lithography generally uses pure water as the immersion medium. This technology, combined with a projection lens having a NA of at least 1.0, is important for the ArF lithography to survive to the 65 nm node and forth, with a further development thereof being accelerated.

The resist composition of the invention allows the feature size of the pattern after development to be reduced by various shrinkage techniques. For example, the hole size can be shrunk by such known techniques as thermal flow, RELACS, SAFIRE, and WASOOM. More effective shrinkage of hole size by thermal flow is possible particularly when a hydrogenated cycloolefin ROMP polymer having a low Tg or the like is blended in the composition.

Advantageous Effects of Invention

When used in resist material, the specific carboxylic acid sulfonium salt is highly hydrophobic because of a fluorinated anion. The salt has advantages of least leaching in immersion water and controlled acid diffusion, and enables to construct a pattern profile with high resolution. Since the specific carboxylic acid sulfonium salt which has not undergone decomposition or acid exchange by exposure has high solubility in or high affinity to alkaline developer, few defects form after development. Thus the chemically amplified positive resist composition is quite useful for the ArF immersion lithography.

BRIEF DESCRIPTION OF ACCOMPANYING DRAWINGS

FIG. 1 is a diagram of $^{19}$F-NMR spectrum of the compound obtained in Synthesis Example 1.

DESCRIPTION OF EMBODIMENTS

As used herein, the singular forms "a," "an" and "the" include plural referents unless the context clearly dictates otherwise. The notation (Cn-Cm) means a group containing from n to m carbon atoms per group.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure bake
PAG: photoacid generator In structural formulae, the broken line indicates a valence bond. Me, Ph, and Ac stand for methyl, phenyl, and acetyl, respectively.

A first embodiment of the invention is a chemically amplified positive resist composition for ArF immersion lithography, comprising as essential components, (A) a triarylsulfonium 2,3,3,3-tetrafluoro-2-(1,1,2,2,3,3,3-heptafluoropropoxy)propionate having the general formula (1-1),
(B) one or more acid generator having the general formula (1-2),
(C) a base resin having an acidic functional group protected with an acid labile group, which is insoluble or substantially insoluble in alkaline developer, but turns soluble in alkaline developer upon deprotection of the acid labile group, and
(D) an organic solvent.

The sulfonium salt having formula (1-1) is described in detail.

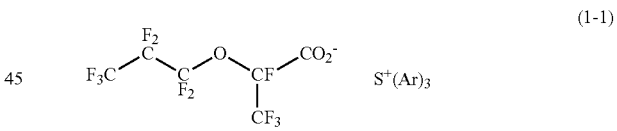

(1-1)

In formula (1-1), Ar is a substituted or unsubstituted $C_6$-$C_{20}$ aryl group which may contain a heteroatom, or a plurality of Ar groups may bond directly or via an oxygen atom, methylene, sulfone or carbonyl moiety. Typical of the heteroatom contained are oxygen, nitrogen, sulfur and halogen atoms, with the oxygen or fluorine atom being preferred. Suitable substituent radicals include straight, branched or cyclic $C_1$-$C_6$ alkyl radicals, straight, branched or cyclic $C_1$-$C_6$ alkoxy radicals, alkoxyalkyl radicals, alkoxyalkoxy radicals, hydroxyl radicals, fluoro, chloro, N,N-dialkylamino radicals in which the alkyl moiety has 1 to 4 carbon atoms, mono- or polycyclic lactone radicals of 4 to 10 carbon atoms, straight, branched or cyclic $C_1$-$C_{14}$ alkyloxycarbonylmethoxy radicals, methylthio radicals, phenylthio radicals, and $C_1$-$C_{11}$ acyloxy radicals. Although the number of substituent radicals is arbitrary, mono or di-substitution is preferred, if any, with mono-substitution being most preferred. Exemplary substituent radicals include methyl, ethyl, propyl, 1-methylethyl, butyl, 1,1-dimethylethyl, hexyl, cyclohexyl, methoxy, ethoxy, propoxy, butoxy, 1,1-dimethylethoxy, hexyloxy, cyclohexyloxy, 2-methoxyethoxy, 2-(2-methoxyethoxy) ethoxy, 2,2,2-trifluoroethoxy, N,N-dimethylamino, 1,1-dimethylethoxycarbonylmethoxy, 1-methyladamantan-1-yloxycarbonylmethoxy, acetyl, pivaloyloxy, and adamantan-1-ylcarbonyloxy.

Suitable groups of Ar include, but are not limited to, phenyl, naphthyl (with any substitution position to the sulfur atom of sulfonium cation), anthryl, phenanthryl, pyrenyl, tolyl, xylyl, trimethylphenyl (with any substitution position to the sulfur atom of sulfonium cation), ethylphenyl, biphenylyl, methoxyphenyl, fluorophenyl, difluorophenyl, t-butylphenyl, ethoxyphenyl, butoxyphenyl, t-butoxyphenyl, methylthiophenyl, trifluoromethylphenyl, acetoxyphenyl, hydroxyphenyl, N,N-dimethylaminophenyl, methylnaphthyl, hydroxynaphthyl, dihydroxynaphthyl, methoxynaphthyl, butoxynaphthyl, 2,2,2-trifluoroethoxynaphthyl, and (2-methoxyethoxy)naphthyl. Also included are aryl groups having a polymerizable substituent radical such as acryloyloxy or methacryloyloxy. Exemplary such groups include 4-acryloyloxyphenyl, 4-methacryloyloxyphenyl, 4-acryloyloxy-3,5-dimethylphenyl, 4-methacryloyloxy-3,5-dimethylphenyl, 4-vinyloxyphenyl, and 4-vinylphenyl. Inter alia, phenyl, 4-tert-butylphenyl, and 4-tert-butoxyphenyl groups are preferred.

When a plurality of Ar groups bond directly or via an oxygen atom, methylene, sulfone or carbonyl moiety, dibenzothiophene skeleton, phenoxathiin skeleton, and other partial structures as shown below are exemplary.

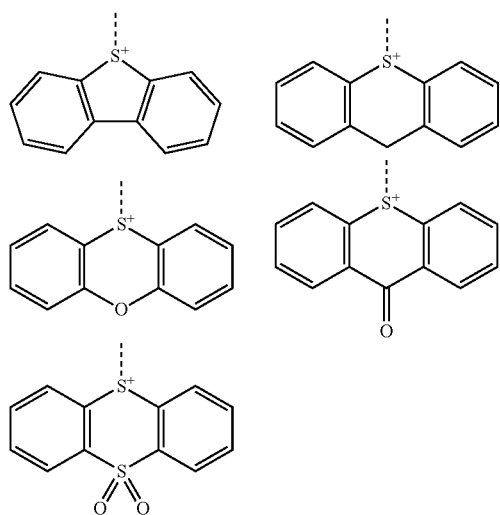

Herein the broken line denotes a bond to another Ar group.

Examples of the sulfonium cation include, but are not limited to, triphenylsulfonium, 4-hydroxyphenyldiphenylsulfonium, bis(4-hydroxyphenyl)phenylsulfonium, tris(4-hydroxyphenyl)sulfonium, 4-tert-butoxyphenyldiphenylsulfonium, bis(4-tert-butoxyphenyl)phenylsulfonium, tris(4-tert-butoxyphenyl)sulfonium, 3-tert-butoxyphenyldiphenylsulfonium, bis(3-tert-butoxyphenyl)phenylsulfonium, tris(3-tert-butoxyphenyl)sulfonium, 4-tert-butylphenyldiphenylsulfonium, tris(4-tert-butylphenyl)sulfonium, 3,4-di-tert-butoxyphenyldiphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, 10-phenylphenoxathiinium, S-phenyldibenzothiophenium, 4-tert-butoxycarbonylmethyloxyphenyldiphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, (4-hydroxy-3,5-dimethylphenyl)diphenylsulfonium, and (4-n-hexyloxy-3,5-dimethylphenyl)diphenylsulfonium.

Also included are 4-methacryloyloxyphenyldiphenylsulfonium, 4-acryloyloxyphenyldiphenylsulfonium, 4-methacryloyloxyphenyldimethylsulfonium, 4-acryloyloxyphenyldimethylsulfonium, (4-methacryloyloxy-3,5-dimethylphenyl)diphenylsulfonium, and (4-acryloyloxy-3,5-dimethylphenyl)diphenylsulfonium.

Of these, triphenylsulfonium, 4-tert-butylphenyldiphenylsulfonium, 4-tert-butoxyphenyldiphenylsulfonium, 10-phenylphenoxathiinium, and S-phenyldibenzothiophenium are more preferred. Inter alia, triphenylsulfonium, 4-tert-butylphenyldiphenylsulfonium, and 4-tert-butoxyphenyldiphenylsulfonium are most preferred.

The sulfonium cation may be a so-called alkylsulfonium cation that is a cation having an alkyl group directly bonded thereto. However, since a combination of an alkylsulfonium cation which is highly active to high-energy radiation and a nucleophilic agent (such as 4-butoxynaphthyl-1-thiacyclopentanium cation) with 2,3,3,3-tetrafluoro-2-(1,1,2,2,2-heptafluoropropoxy)propionic acid anion often has low stability by itself or in resist solution, a so-called triarylsulfonium cation as represented by formula (1-1) is desirable in order to provide such a combination with stability.

The specific carboxylic acid used herein is described in U.S. Pat. No. 3,271,341. It may be synthesized from a carboxylic acid or a lithium, sodium, potassium, calcium, tetramethylammonium, tetraethylammonium or tetrabutylammonium salt of carboxylic acid and used as the anion of the sulfonium salt having formula (1-1).

The synthesis of the sulfonium cation is well known. Synthesis may be carried out according to the teachings of JP-A 2007-145797, JP-A 2009-007327, and JP-A 2009-091350, for example.

With respect to the polymerizable sulfonium cation, reference may be made to JP-A H04-230645 and JP-A 2005-084365. The polymerizable sulfonium salt may be used as the monomer from which units of a polymer to be described later are derived.

Ion exchange reaction between the foregoing 2,3,3,3-tetrafluoro-2-(1,1,2,2,3,3,3-heptafluoropropoxy)-propionic acid or a salt thereof and a sulfonium cation may be performed in an organic solvent (e.g., dichloromethane, ethyl acetate, methyl isobutyl ketone, methanol, ethanol or acetonitrile) alone or in admixture with water. After removal of the salt component by-produced, the product may be purified by a standard technique such as recrystallization or chromatography.

The specific carboxylic acid sulfonium salt having formula (1-1) may be used alone or in admixture of two or more.

In the resist composition, the specific carboxylic acid sulfonium salt having formula (1-1) may be used in any desired amount as long as the benefits of the invention are not compromised. An appropriate amount is 0.1 to 10 parts, more preferably 0.1 to 8 parts by weight per 100 parts by weight of the base resin (C) to be described later. Outside the range, an excess amount of the salt having formula (1-1) may cause a lowering of sensitivity and degradation of resolution.

Component (B) is a photoacid generator having the general formula (1-2):

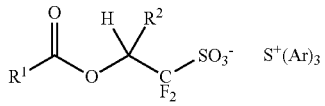
(1-2)

wherein $R^1$ is a $C_1$-$C_{30}$ alkyl, alkenyl or aralkyl group which may contain a heteroatom, $R^2$ is hydrogen or trifluoromethyl, and Ar is a substituted or unsubstituted $C_6$-$C_{20}$ aryl group which may contain a heteroatom, or a plurality of Ar groups may bond together directly or via an oxygen atom, methylene, sulfone or carbonyl moiety.

In formula (1-2), $R^1$ is a $C_1$-$C_{30}$ alkyl, alkenyl or aralkyl group which may contain a heteroatom. Exemplary heteroatoms which may be contained in $R^1$ include oxygen, nitrogen, sulfur and halogen atoms, with oxygen being preferred. The $C_1$-$C_{30}$ alkyl, alkenyl or aralkyl group may be straight, branched or cyclic while it is preferred for forming a fine feature size pattern of high resolution that these groups have 6 to 30 carbon atoms. It is undesirable that $R^1$ be aryl, because the resulting resist pattern may have less smooth sidewalls. Suitable groups of $R^1$ include, but are not limited to, methyl, ethyl, propyl, isopropyl, butyl, isobutyl, s-butyl, t-butyl, pentyl, neopentyl, cyclopentyl, hexyl, cyclohexyl, 3-cyclohexenyl, heptyl, 2-ethylhexyl, nonyl, undecyl, tridecyl, pentadecyl, heptadecyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl, eicosanyl, allyl, benzyl, diphenylmethyl, tetrahydrofuryl, methoxymethyl, ethoxymethyl, methylthiomethyl, acetamidomethyl, trifluoromethyl, (2-methoxyethoxy)methyl, acetoxymethyl, 2-carboxy-1-cyclohexyl, 2-oxopropyl, 4-oxo-1-adamantyl, and 3-oxocyclohexyl.

In formula (1-2), $R^2$ is hydrogen or trifluoromethyl. It is preferred that $R^2$ be trifluoromethyl, because the corresponding acid generator having formula (1-2) is more soluble in solvent.

With respect to Ar in formula (1-2), the same as described in conjunction with formula (1-1) is true.

With respect to the synthesis of sulfonium salt having formula (1-2), reference may be made to JP-A 2007-145797, JP-A 2008-106045, JP-A 2009-007327, and JP-A 2009-258695.

Preferred examples of the PAG are given below.

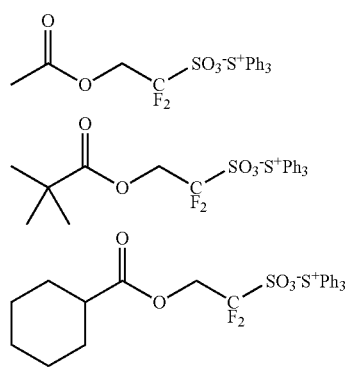

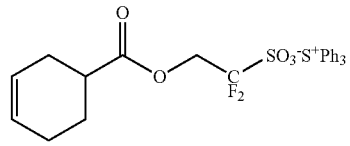

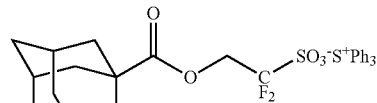

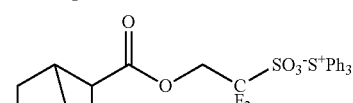

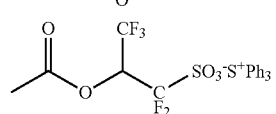

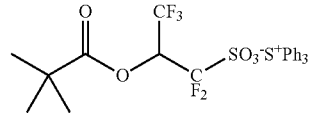

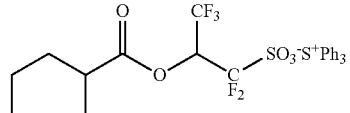

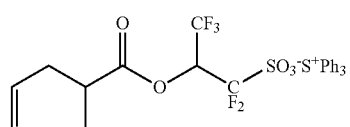

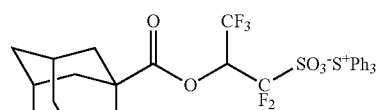

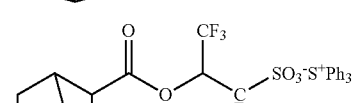

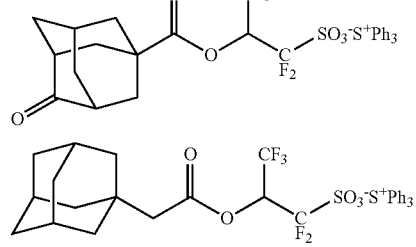

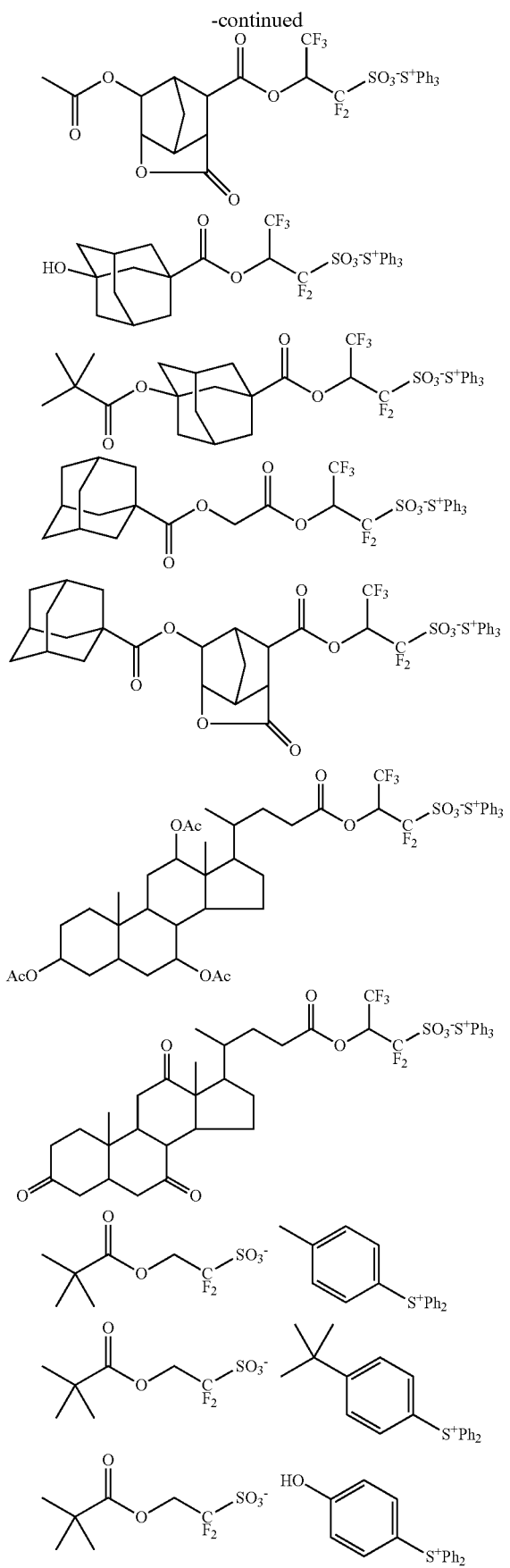
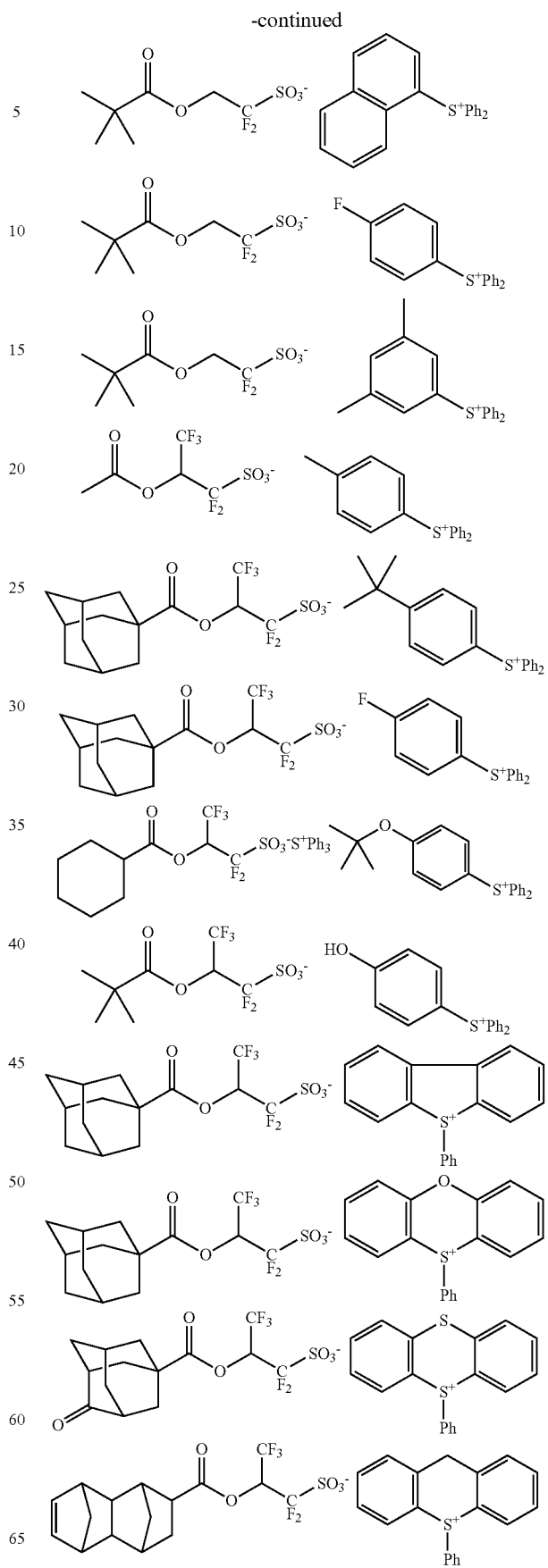

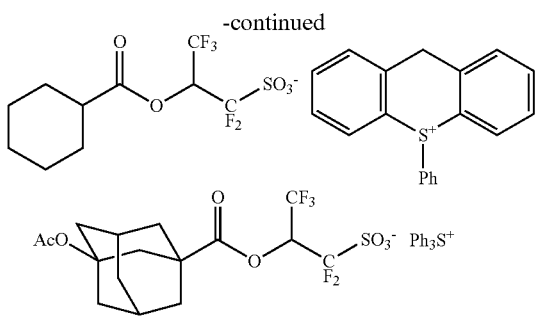

Herein Ac is acetyl and Ph is phenyl.

An appropriate amount of the acid generator having formula (1-2) used is 0.1 to 40 parts, more preferably 0.1 to 20 parts by weight per 100 parts by weight of the base resin (C). Less than 0.1 part of the acid generator may lead to low sensitivity, failing to obtain the desired pattern. More than 40 parts of the acid generator may degrade resolution and leave foreign particles after resist development or stripping.

In another embodiment, component (B) is an acid generator having the general formula (1-3):

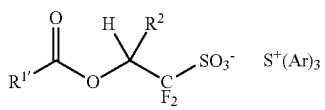
(1-3)

wherein $R^{1'}$ is a backbone of the base resin (C), $R^2$ is hydrogen or trifluoromethyl, and Ar is a substituted or unsubstituted $C_6$-$C_{20}$ aryl group which may contain a heteroatom, or a plurality of Ar groups may bond together directly or via an oxygen atom, methylene, sulfone or carbonyl moiety.

In formula (1-3), $R^{1'}$ denotes a backbone of the base resin. Preferably during preparation of the base resin, a monomer having a vinyl or isopropenyl group bonded thereto directly or via a linking group is copolymerized whereby the acid generator is incorporated in the base resin.

Preferably, the PAG of formula (1-3) is incorporated as recurring units of the general formula (7) into a base resin, specifically a polymer comprising acid labile group-containing recurring units having the general formula (3) and recurring units of at least one type selected from the general formulae (4) to (6).

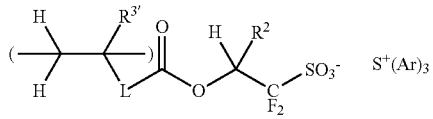
(7)

Herein $R^{3'}$ is hydrogen or methyl. L is a single bond or a divalent hydrocarbon group which may contain an ether (—O—) bond or ester (—COO—) bond, typically a straight, branched or cyclic $C_1$-$C_{12}$ alkylene group, arylene group or a combination thereof. $R^2$ and Ar are as defined above.

Examples of the anion having a vinyl or isopropenyl group bonded thereto via a linking group are shown below. Each structure is shown in a monomer form prior to polymerization while the triarylsulfonium cation is omitted.

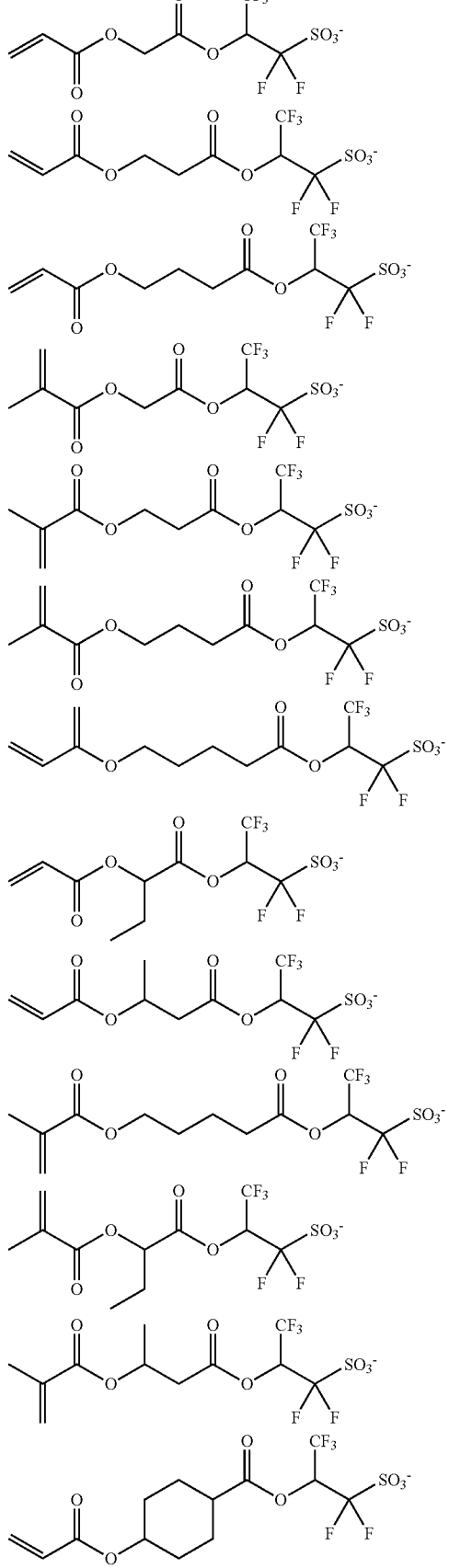

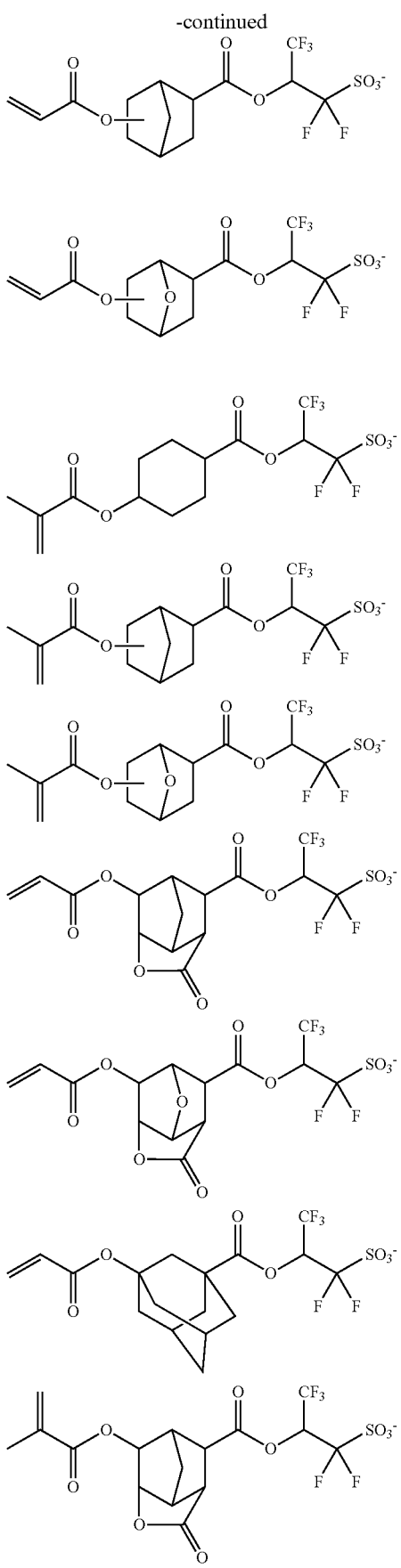
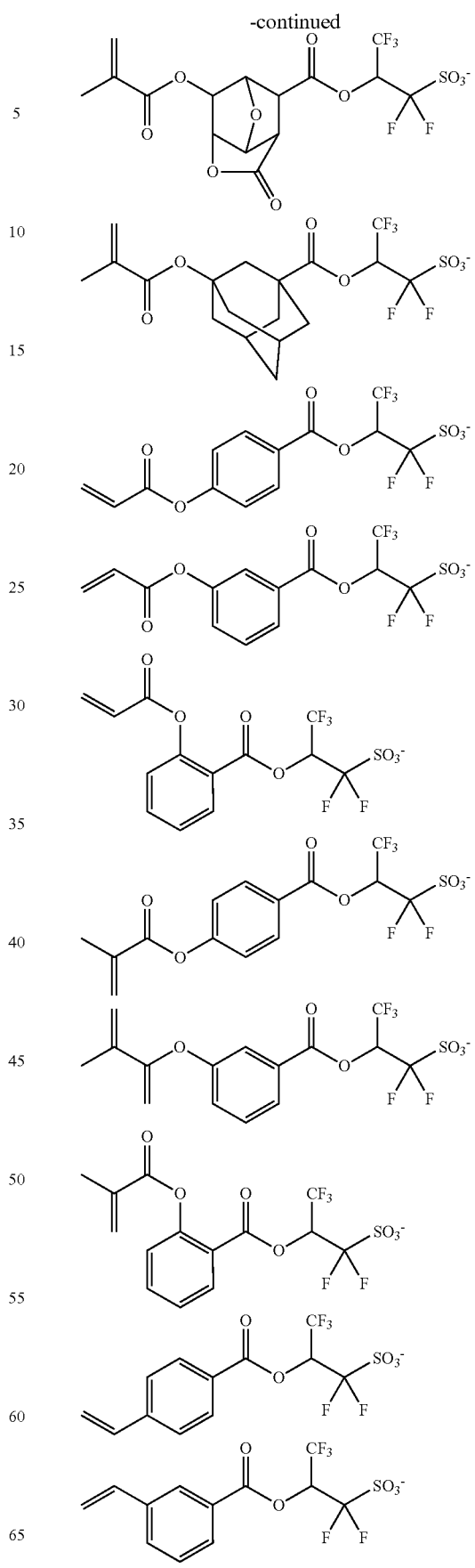

-continued

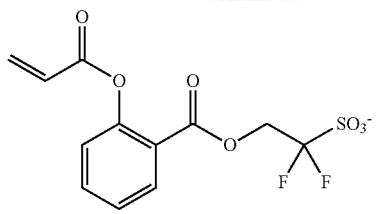
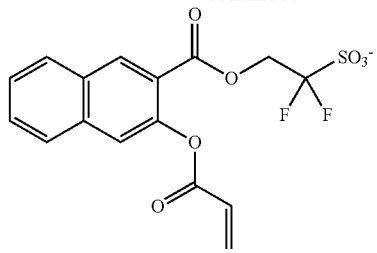
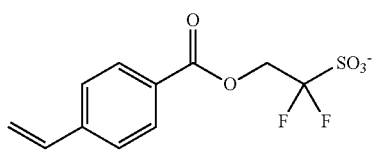
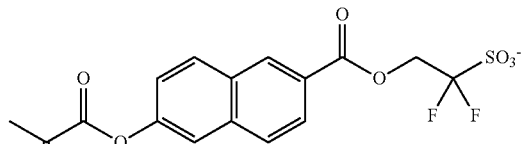
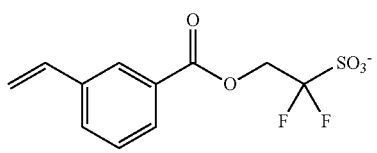
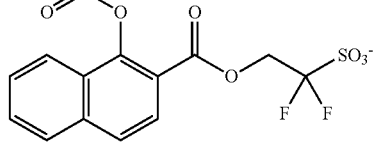
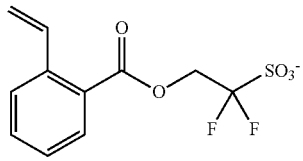
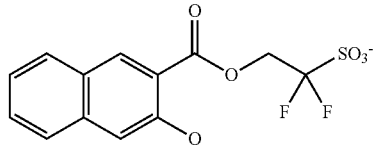
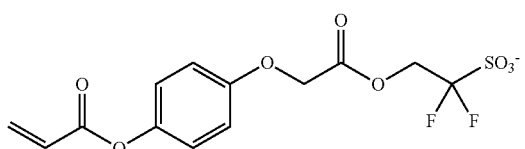
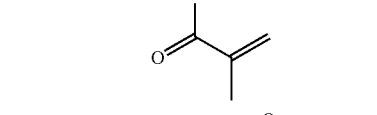
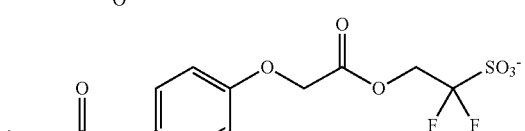
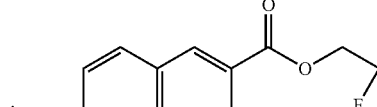
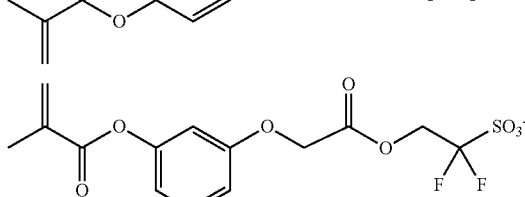
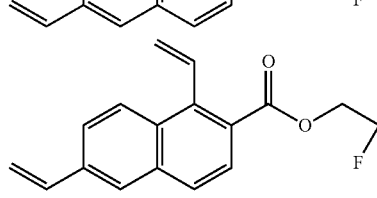
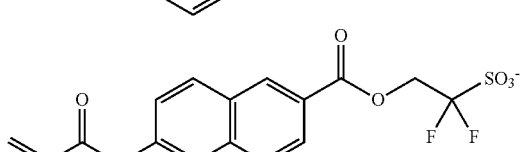
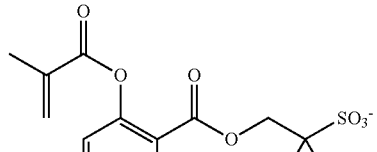
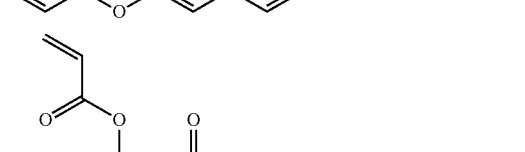
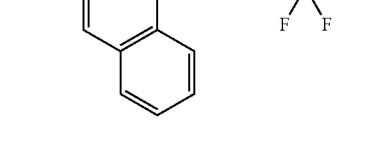
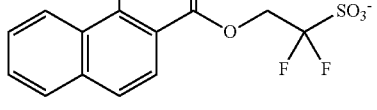
In formula (1-3), $R^2$ is hydrogen or trifluoromethyl. It is preferred that $R^2$ be trifluoromethyl, because the corresponding acid generator having formula (1-3) is more soluble in solvent.

With respect to Ar in formula (1-3), the same as described in conjunction with formula (1-1) is true.

With respect to the synthesis of sulfonium salt having formula (1-3), reference may be made to JP-A 2008-133448, JP-A 2009-217253, JP-A 2010-077404, and JP-A 2010-116550.

When the acid generator has formula (1-3) wherein R' represents a backbone of the base resin (C), it is meant that the unit corresponding to formula (1-3) is incorporated in the resist base resin. In this case, the acid generated by the acid generator is bound to the polymer, so that acid diffusion may be fully restrained. This is desirable for the purpose of forming a fine pattern having a pitch of less than 80 nm. Examples of the recurring unit in this embodiment are given below, but not limited thereto.

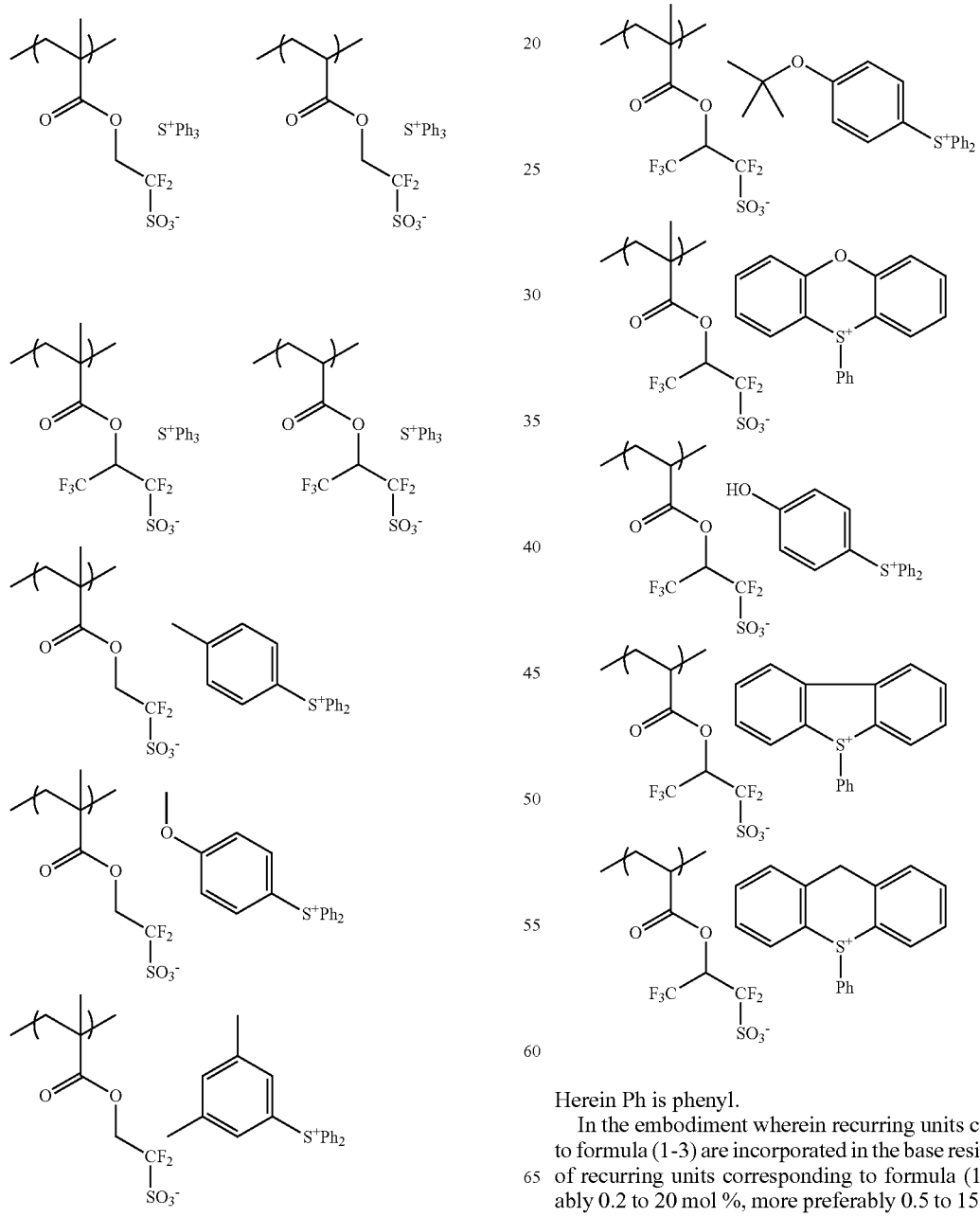

Herein Ph is phenyl.

In the embodiment wherein recurring units corresponding to formula (1-3) are incorporated in the base resin, the content of recurring units corresponding to formula (1-3) is preferably 0.2 to 20 mol %, more preferably 0.5 to 15 mol % based on the total recurring units of the base resin. Too low a content may fail to achieve the incorporation effect whereas too high a content may reduce the solvent solubility of a base resin, causing more coating defects.

In the acid generator having formula (1-2) or (1-3) compounded in the resist composition, difluoromethylene is at α-position of the sulfonate group in the anion. Therefore, the acid generated by this acid generator is a super-strong acid equivalent to trifluoromethanesulfonic acid or the like, so that decomposition reaction of the resist base resin in the exposed region may proceed to a full extent, affording a high dissolution contrast. In addition, in the case of the acid generator of formula (1-2), the presence of acyloxy group in the anion increases polarity and molecular weight, controls the volatility and diffusion rate of the generated acid, and eventually contributes to an improvement in resolution of a fine pattern. On the other hand, the acid generator of formula (1-3), which is incorporated within the base resin (C), is effective for controlling diffusion of the acid generated and contributes to an improvement in resolution of a fine pattern. By a choice of $R^1$, $R^2$ and Ar in formula (1-2) or (1-3) from their alternatives, the properties (including transmittance, acid generation efficiency, solvent solubility, polarity, hydrophilicity, in-film distribution, and stability) of the acid generator and the properties (including acidity, diffusion rate, volatility, and affinity to base resin) of the generated acid can be adjusted in accordance with a particular resist base resin and exposure method used. Accordingly the performance (including resolution) of the resist composition can be adjusted optimum.

The acid generators having formulae (1-2) and (1-3) may be used alone or in admixture of two or more. It is possible to control the transmittance of a resist film by selecting an acid generator having a low transmittance at the exposure wavelength and adjusting the amount of the acid generator added. If desired, the acid generator having formula (1-2) or (1-3) may be used in combination with another known acid generator, which will be described later.

Component (C) is a base resin having an acidic functional group protected with an acid labile group, which resin is insoluble or substantially insoluble in alkaline developer, but turns soluble in alkaline developer upon deprotection of the acid labile group.

Examples of the base resin or polymer (C) include, but are not limited to, (meth)acrylic acid ester polymers, alternating copolymers of cycloolefin with maleic anhydride, copolymers further containing vinyl ethers or (meth)acrylic acid esters, polynorbornene, cycloolefin ring-opening metathesis polymerization (ROMP) polymers, and hydrogenated cycloolefin ROMP polymers. The base resins may be used alone or in admixture of two or more. In the case of positive resist compositions, it is a common practice to substitute an acid labile group for the hydroxyl moiety of a carboxyl group for reducing the rate of dissolution in unexposed regions.

In a preferred embodiment, the base resin may comprise recurring units having an acid labile group represented by the general formula (3) and recurring units of at least one type selected from the general formulae (4) to (6).

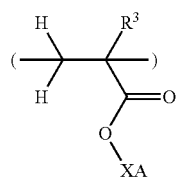

(3)

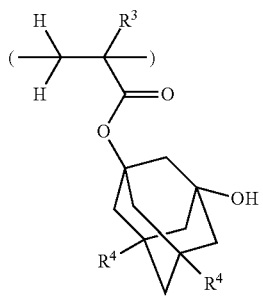

(4)

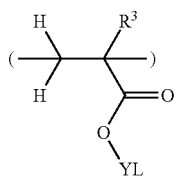

(5)

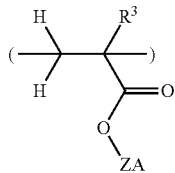

(6)

Herein $R^3$ is hydrogen, fluorine, methyl or trifluoromethyl. XA is an acid labile group. $R^4$ is each independently hydrogen or hydroxyl. YL is a substituent group having a lactone structure. ZA is hydrogen, a $C_1$-$C_{15}$ fluoroalkyl group or $C_1$-$C_{15}$ fluoroalcohol-containing substituent group. Understandably, when the PAG having formula (1-3) is used, recurring units having formula (7) may be copolymerized with the above recurring units.

A polymer comprising recurring units having formula (3) functions such that it may be decomposed to generate carboxylic acid under the action of an acid and turn alkali soluble. The acid labile group represented by XA may be selected from a variety of such groups. Examples of the acid labile group include groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

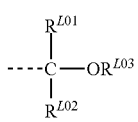

(L1)

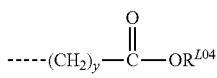

(L2)

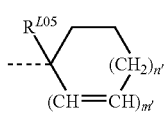

(L3)

-continued

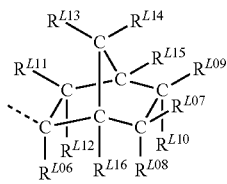
(L4)

It is noted that the broken line denotes a valence bond.

In formula (L1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Exemplary straight, branched or cyclic alkyl groups include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. Illustrative examples of the substituted alkyl groups are shown below.

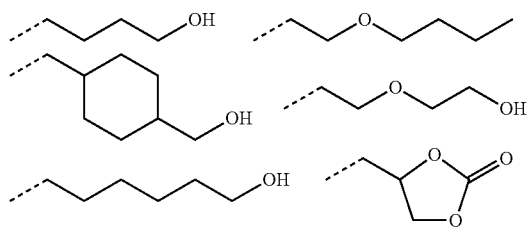

A pair of $R^{L01}$ and $R^{L02}$, $R^{L01}$ and $R^{L03}$, or $R^{L02}$ and $R^{L03}$ may bond together to form a ring with the carbon and oxygen atom to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is an optionally substituted, straight, branched or cyclic $C_1$-$C_8$ alkyl group or an optionally substituted $C_6$-$C_{20}$ aryl group. Examples of the optionally substituted alkyl group include straight, branched or cyclic alkyl groups such as methyl, ethyl, propyl, isopropyl, n-butyl, sec-butyl, tert-butyl, tert-amyl, n-pentyl, n-hexyl, cyclopentyl and cyclohexyl, and substituted forms of the foregoing in which some hydrogen atoms are substituted by hydroxyl, alkoxy, carboxyl, alkoxycarbonyl, oxo, amino, alkylamino, cyano, mercapto, alkylthio, sulfo or the like. Examples of the optionally substituted aryl groups include phenyl, methylphenyl, naphthyl, anthryl, phenanthryl, and pyrenyl. Letter m' is equal to 0 or 1, n' is equal to 0, 1, 2 or 3, and 2 m'+n' is equal to 2 or 3.

In formula (L4), $R^{L06}$ is an optionally substituted, straight, branched or cyclic $C_1$-$C_8$ alkyl group or an optionally substituted $C_6$-$C_{20}$ aryl group. Examples of these groups are the same as exemplified for $R^{L05}$. $R^{L07}$ to $R^{L16}$ independently represent hydrogen or $C_1$-$C_{15}$ monovalent hydrocarbon groups. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of the foregoing in which some hydrogen atoms are replaced by hydroxyl, alkoxy, carboxyl, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, $R^{L14}$ and $R^{L15}$, or a similar pair).

Of the acid labile groups of formula (L1), the straight and branched ones are exemplified by the following groups.

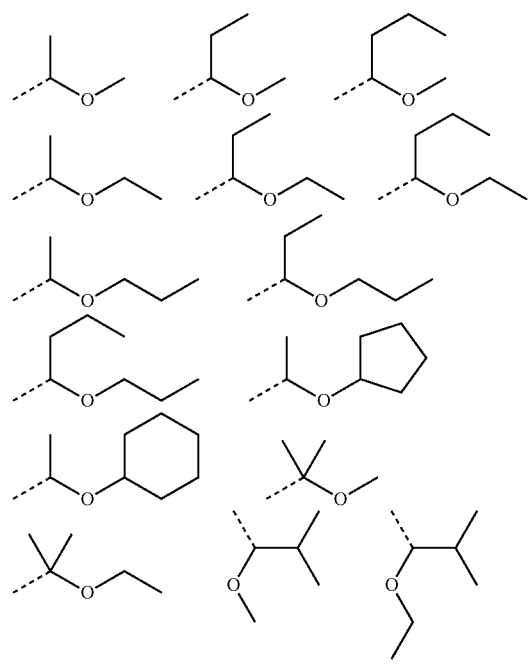

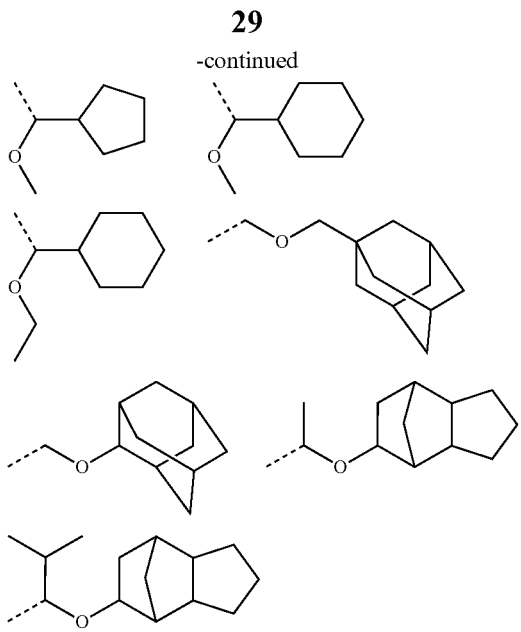

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

Of the acid labile groups having formula (L4), groups having the following formulas (L4-1) to (L4-4) are preferred.

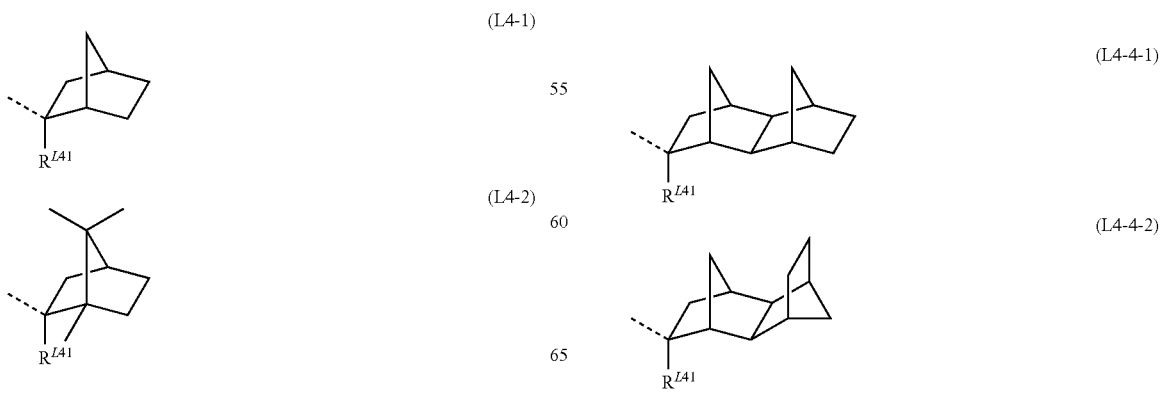

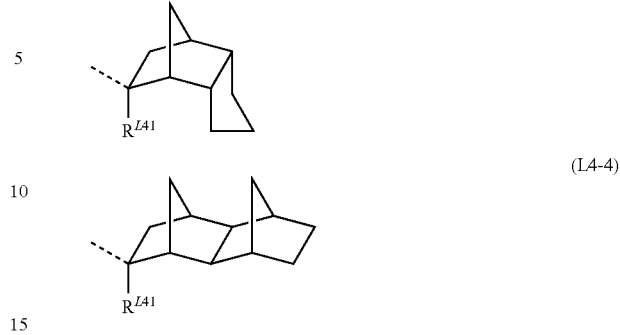

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

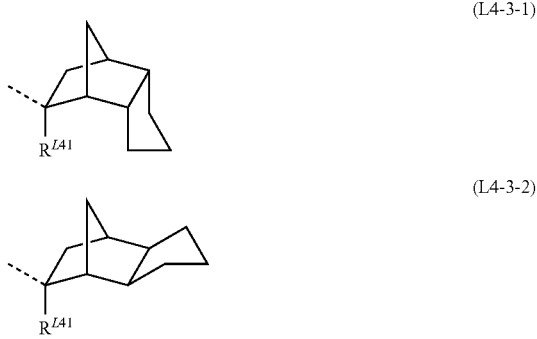

Similarly, the general formula (L4-4) represents one or a mixture of two or more selected from groups having the following general formulas (L4-4-1) to (L4-4-4).

(L4-4-3)

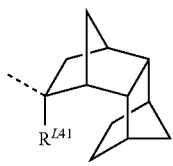

(L4-4-endo)

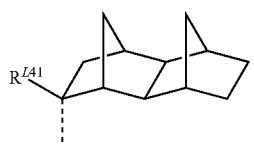

Illustrative examples of the acid labile group of formula (L4) are given below.

(L4-4-4)

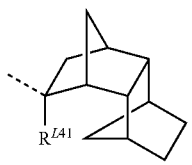

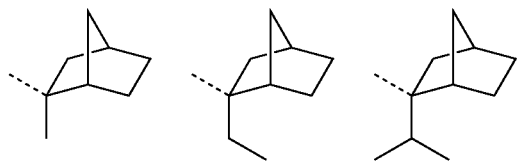

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo [2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

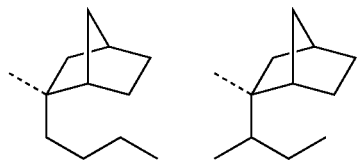

(L4-1-endo)

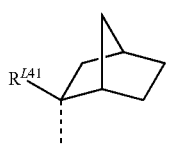

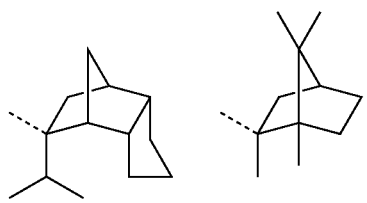

(L4-2-endo)

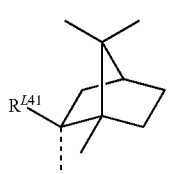

(L4-3-endo)

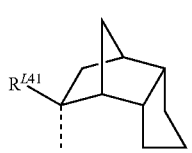

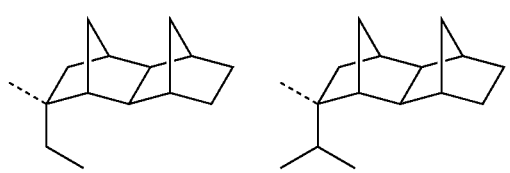

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups are as exemplified for $R^{L04}$.

Illustrative examples of the recurring units of formula (3) are given below, but not limited thereto.
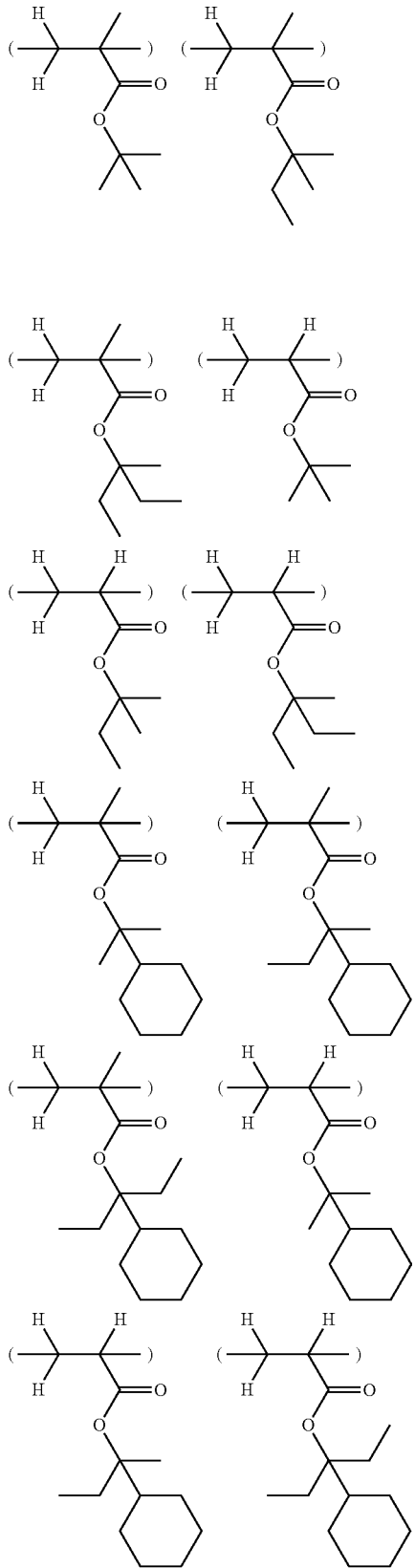
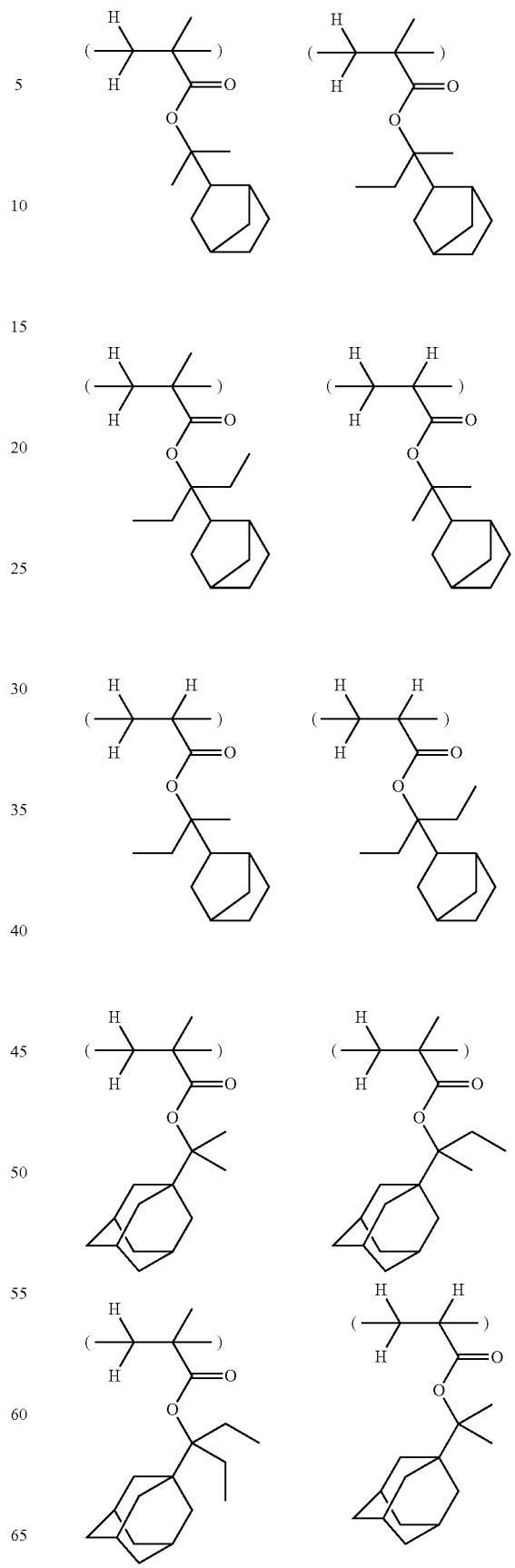

-continued
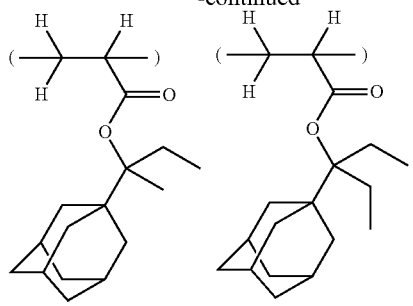
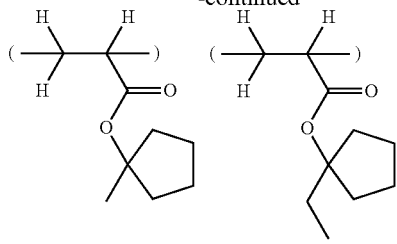
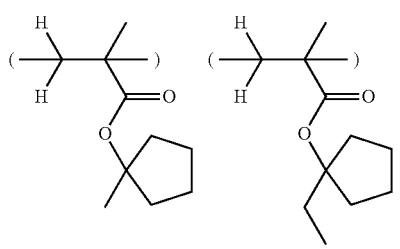
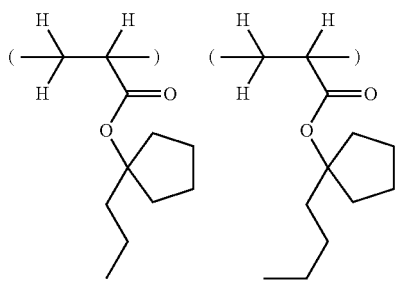
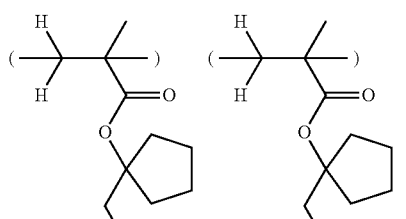
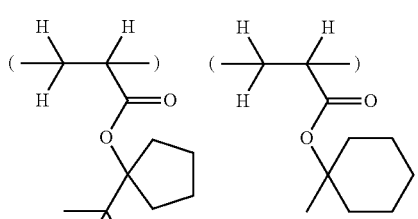
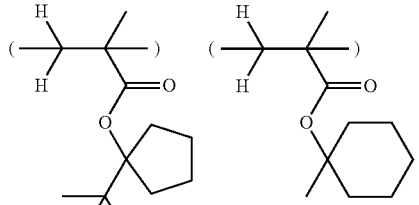
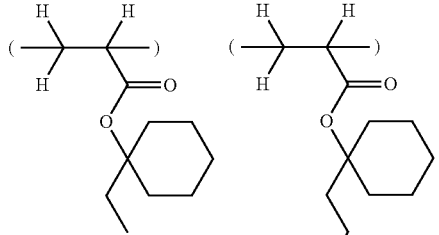
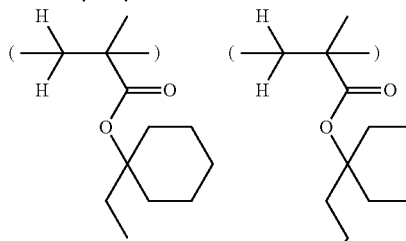
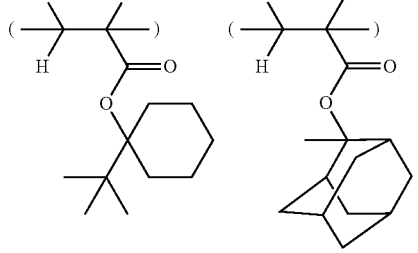
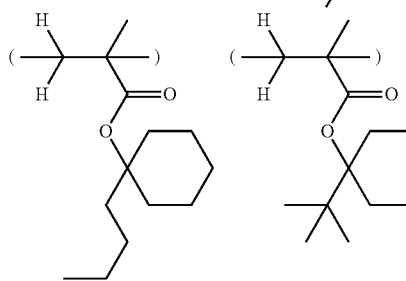
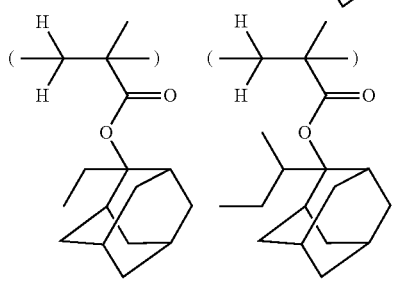

-continued
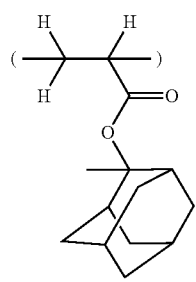
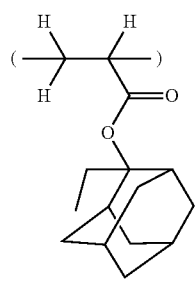
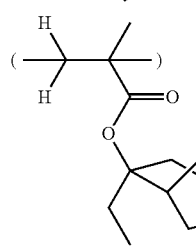
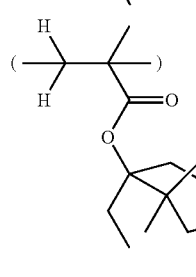
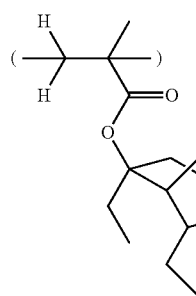
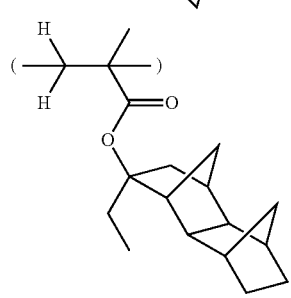
-continued
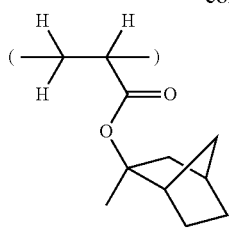 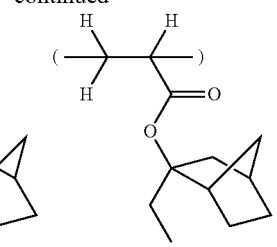
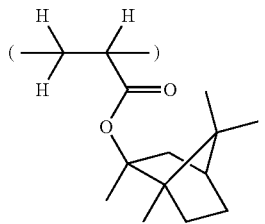 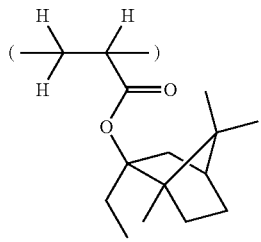
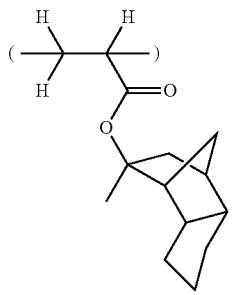 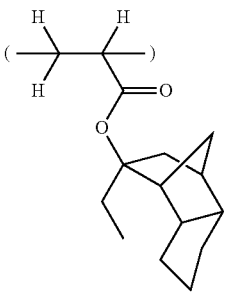
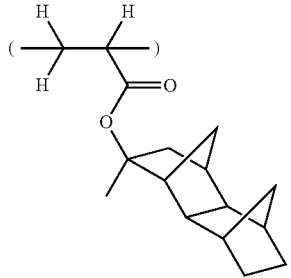
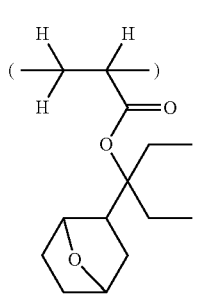 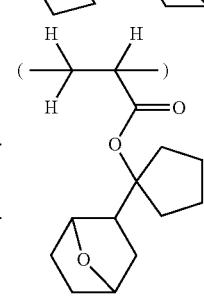

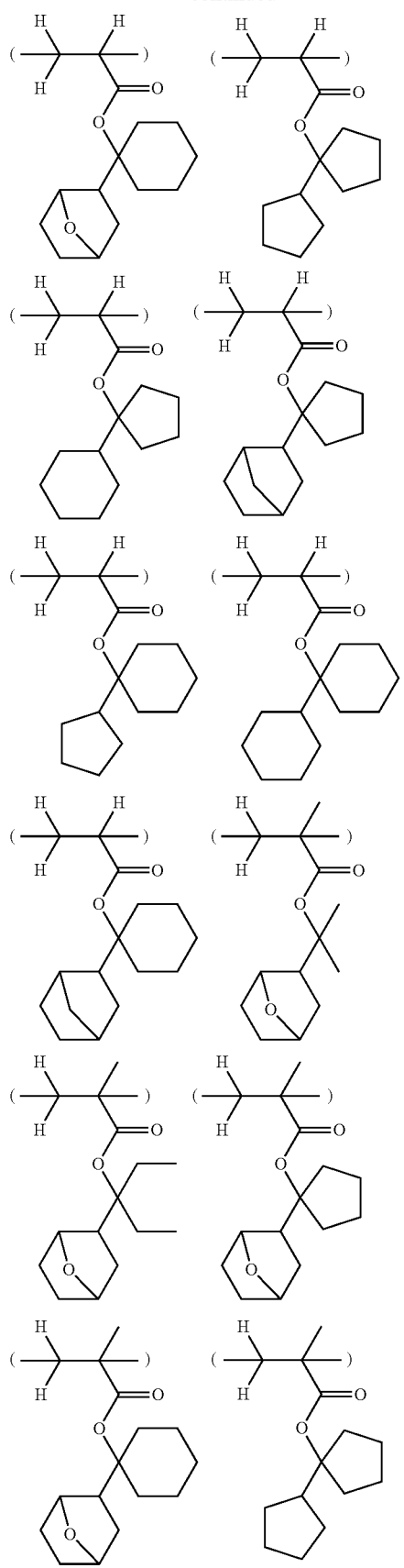
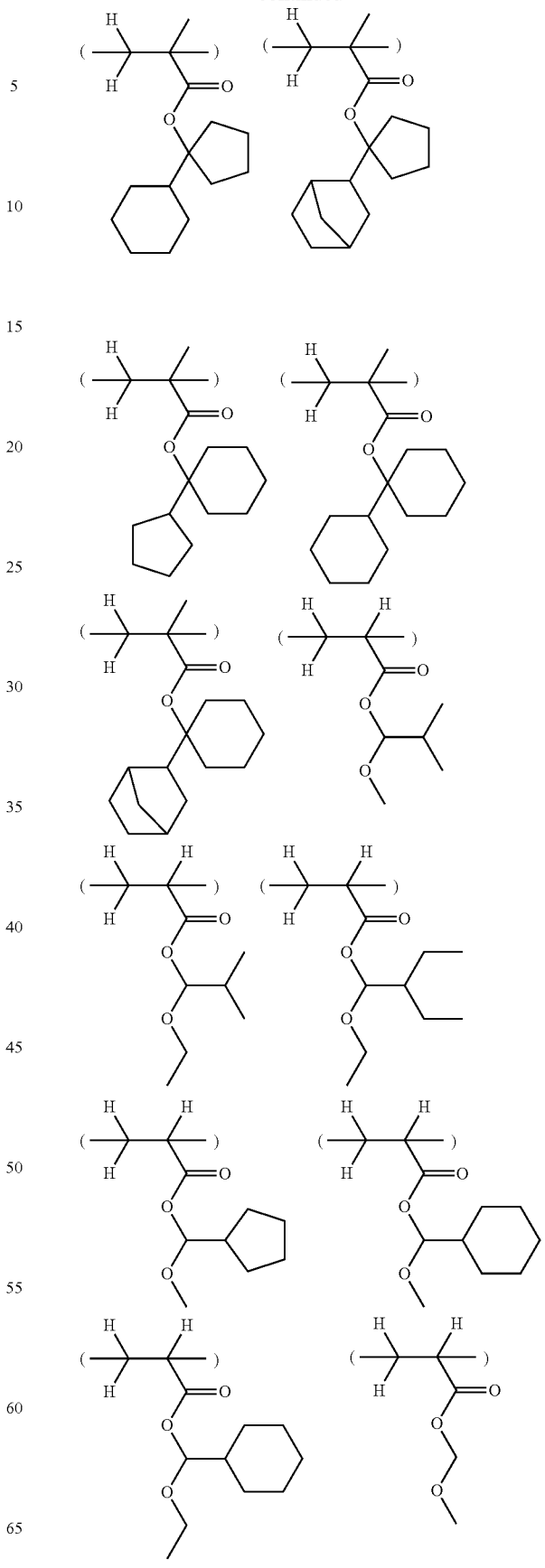

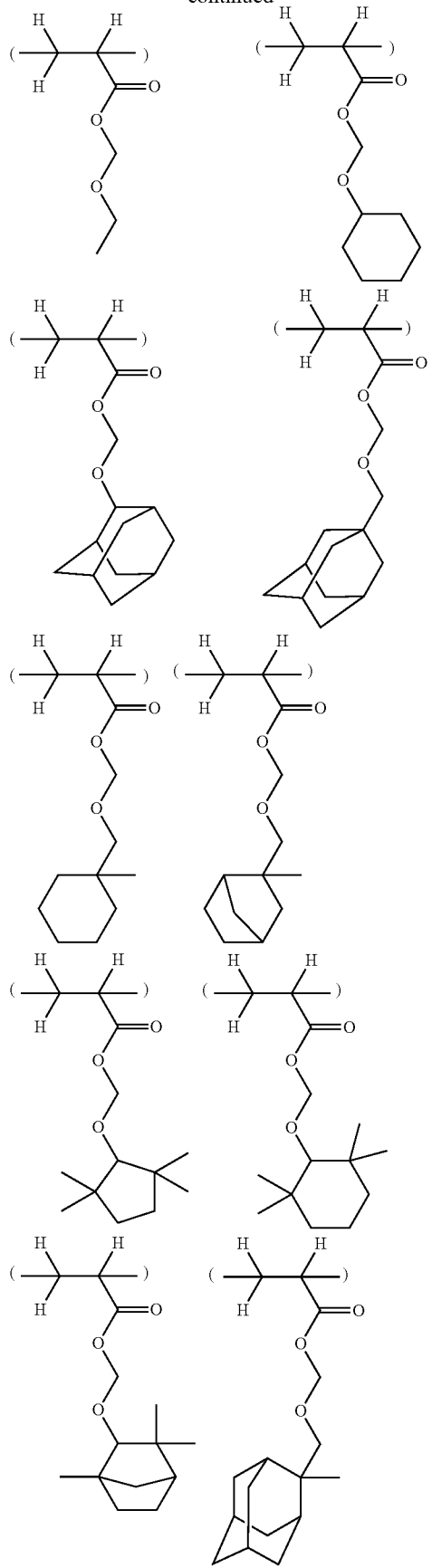
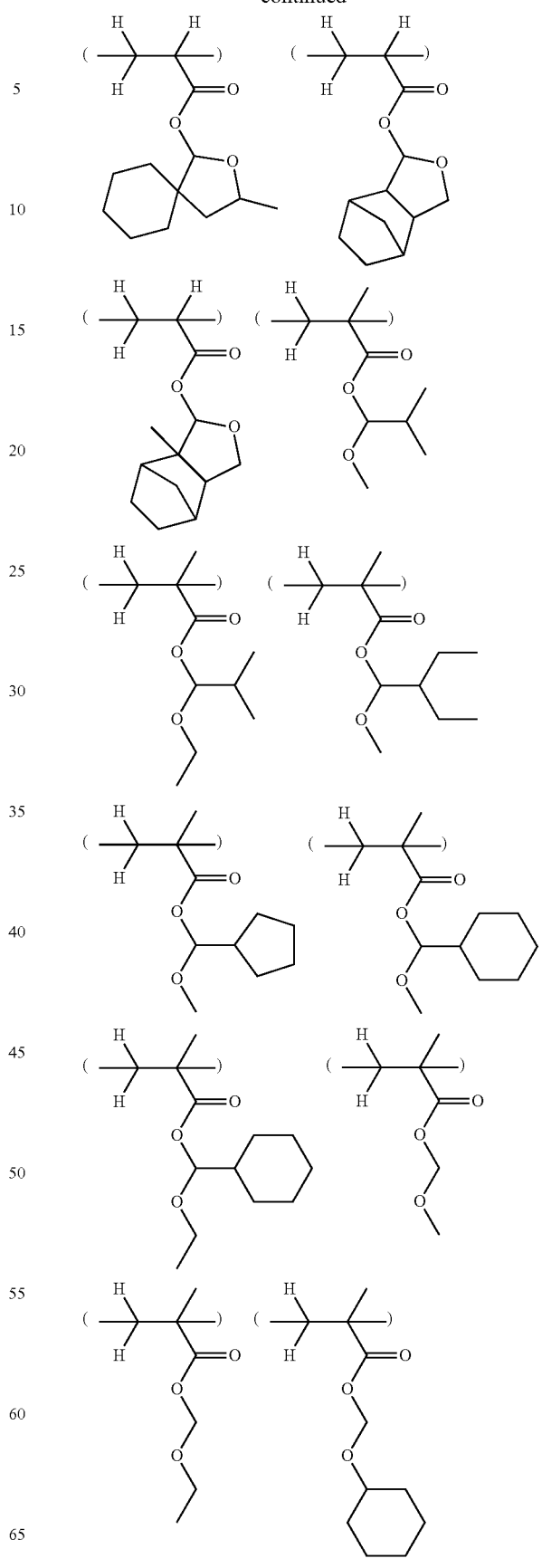

-continued
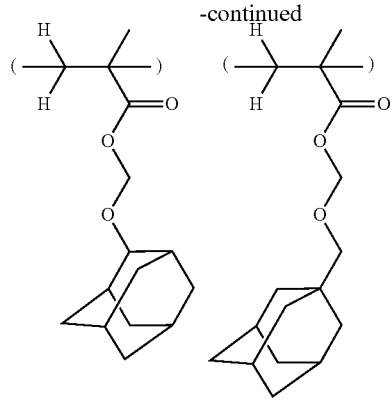
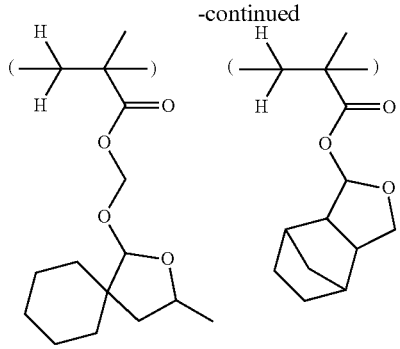
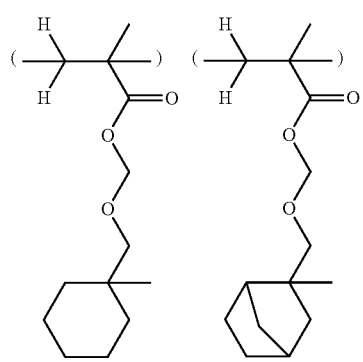
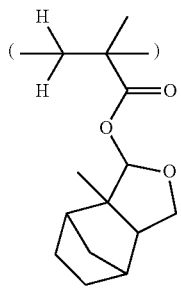
Illustrative examples of the recurring units of formula (4) are given below, but not limited thereto.
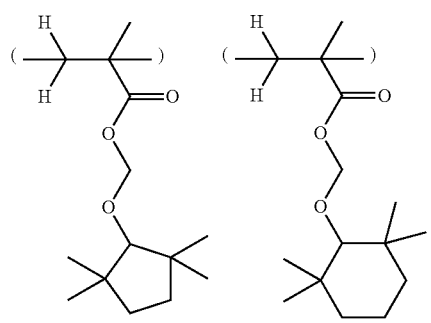
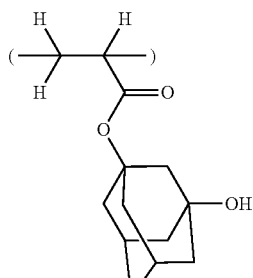
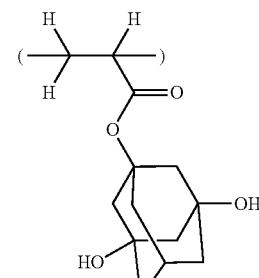
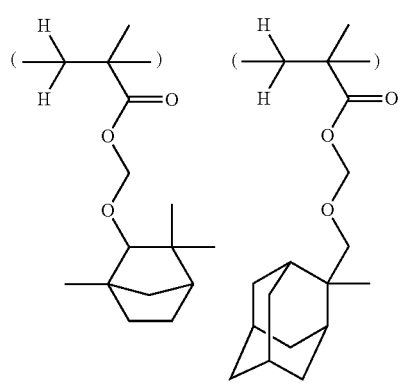
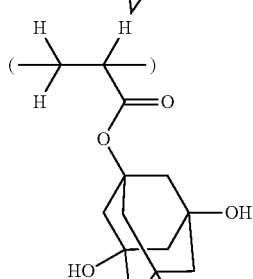
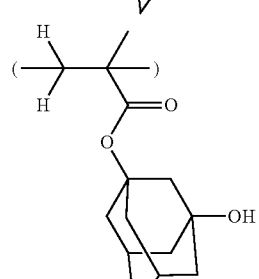
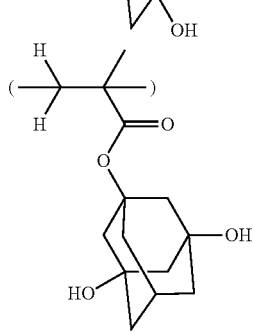
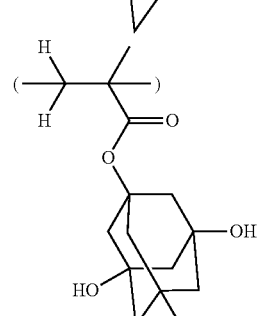

Illustrative examples of the recurring units of formula (5) are given below, but not limited thereto.
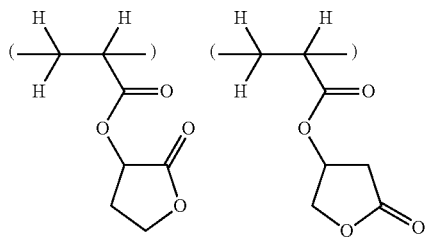
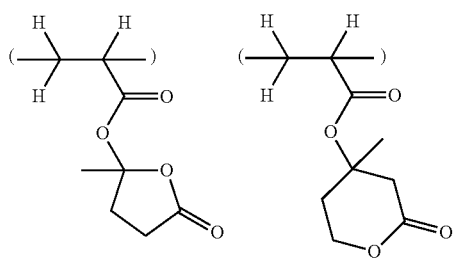
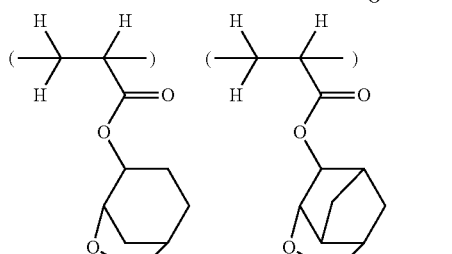
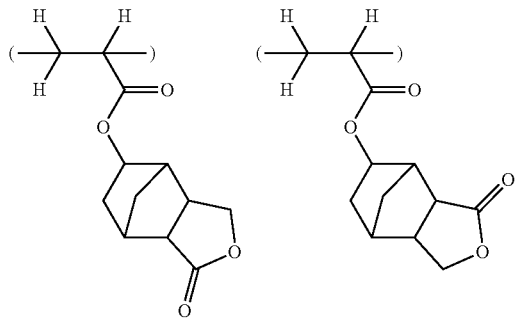
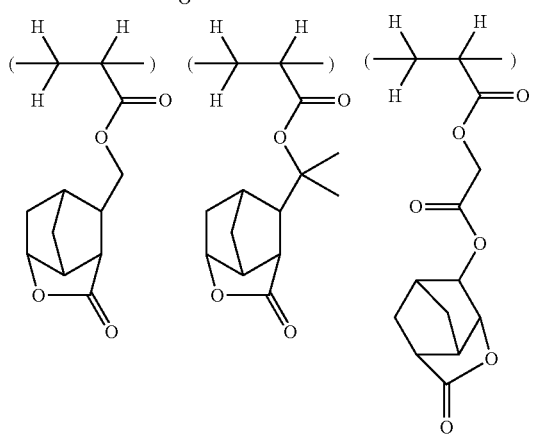
-continued
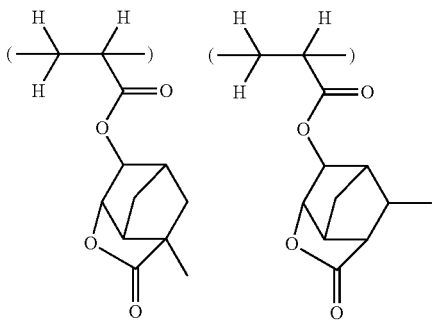
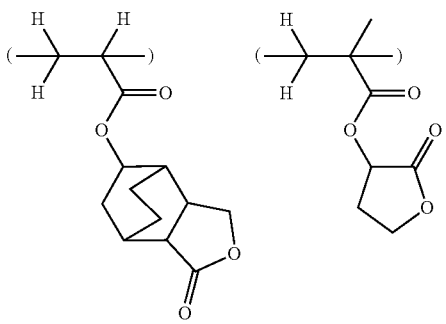
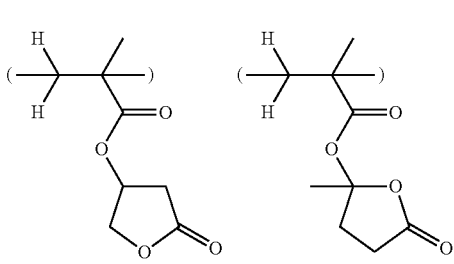
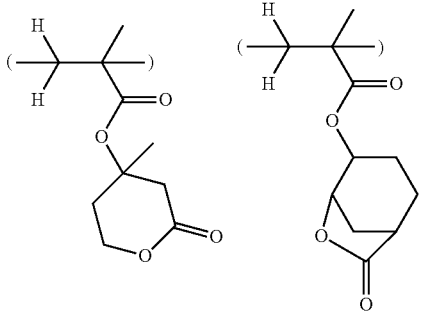
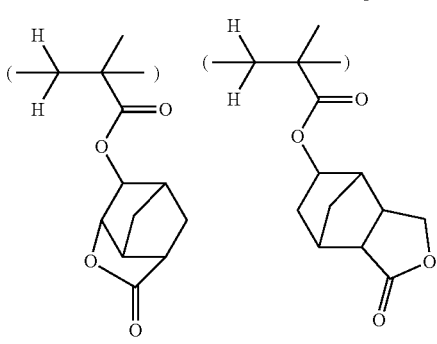

-continued
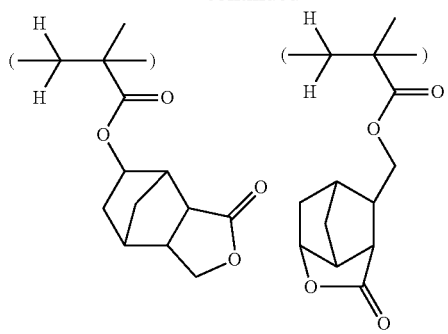
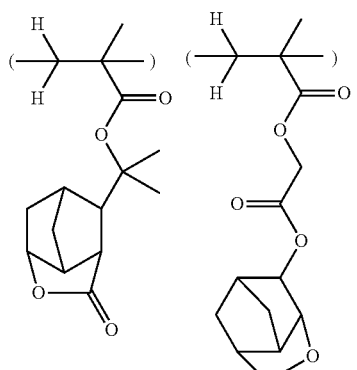
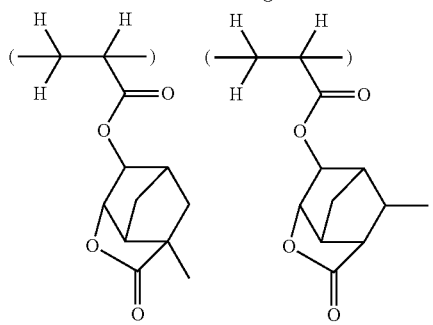
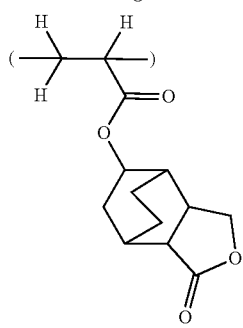
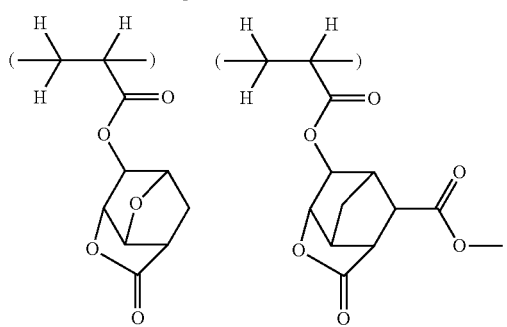
-continued
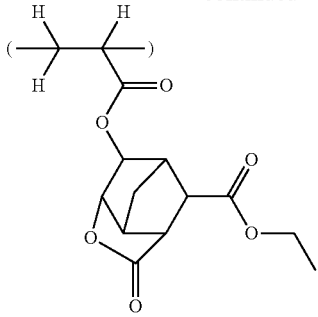
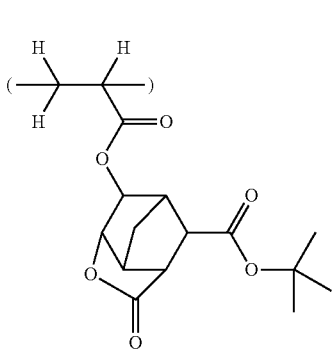
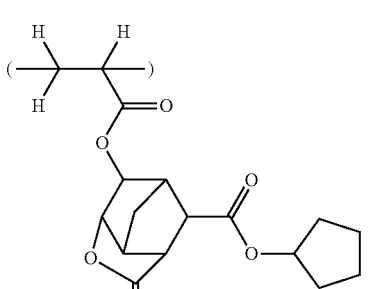
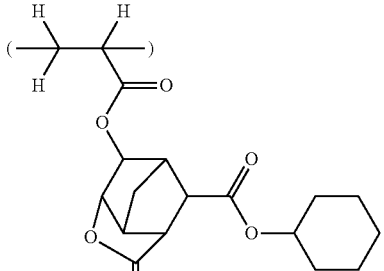
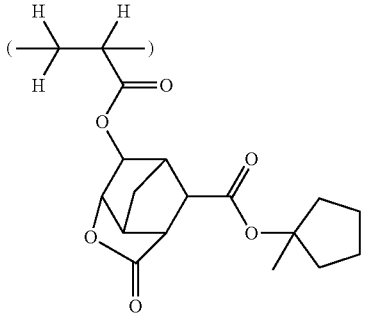

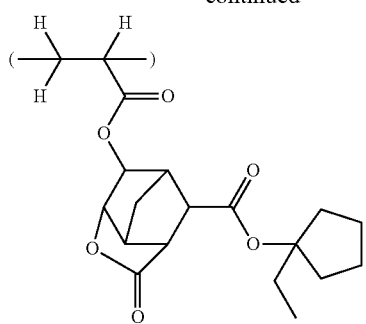
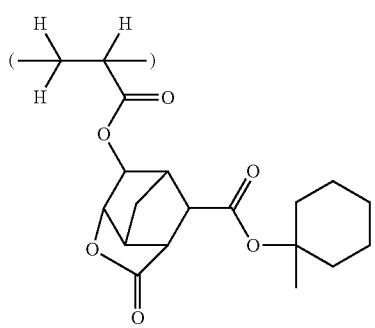
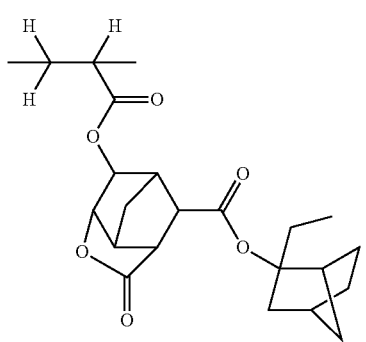
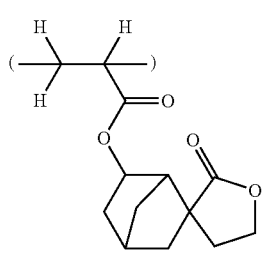
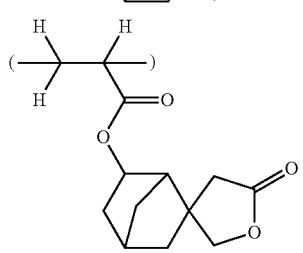
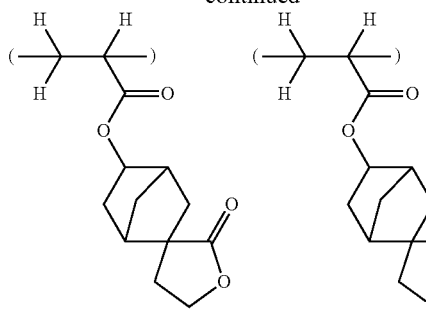
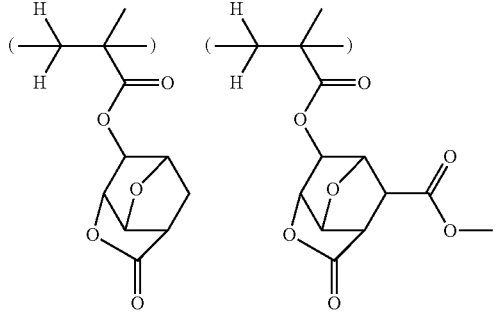
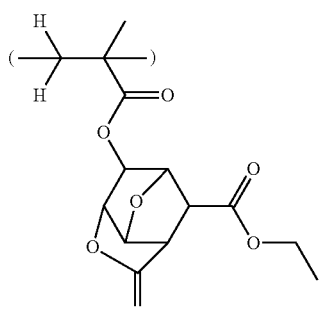
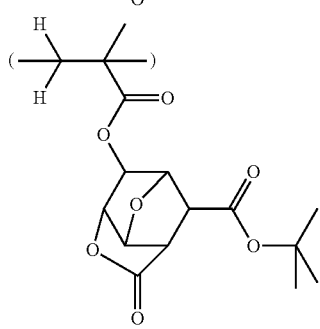
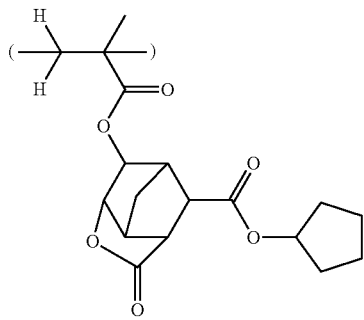

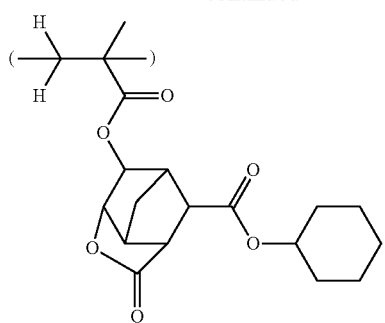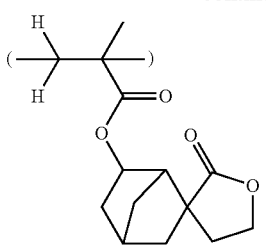
Illustrative examples of the recurring units of formula (6) are given below, but not limited thereto.

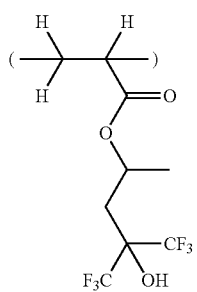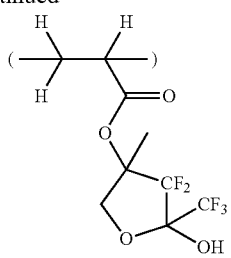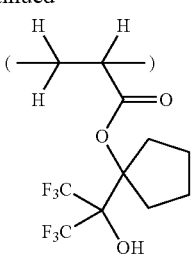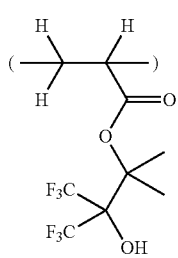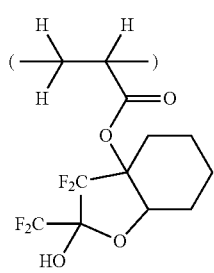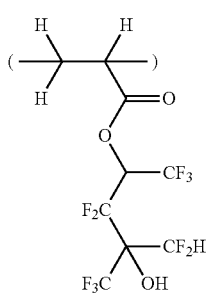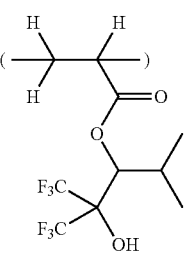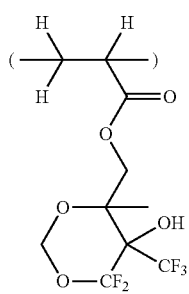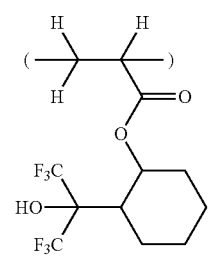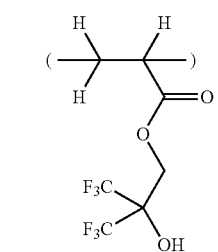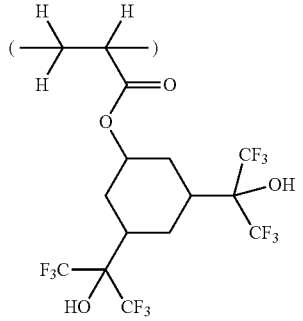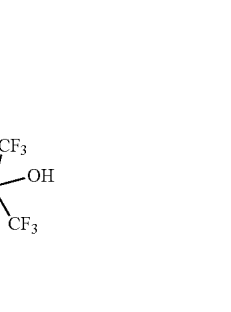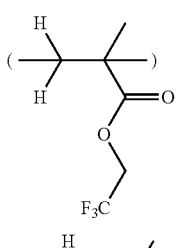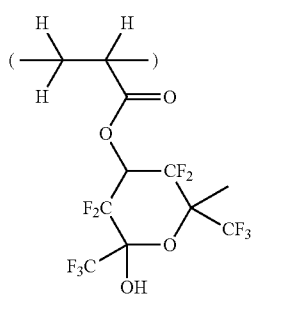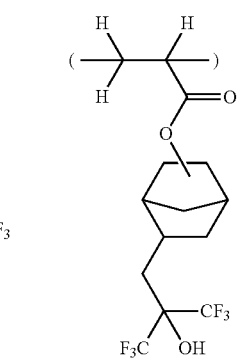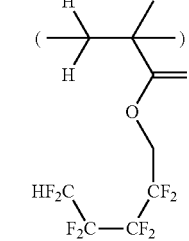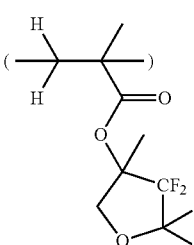

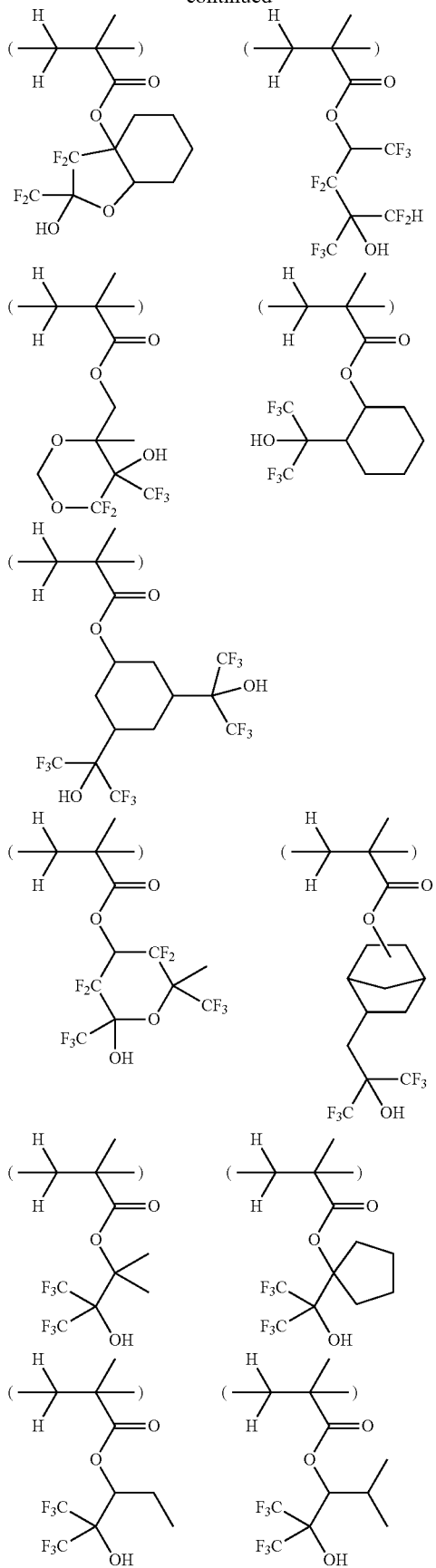

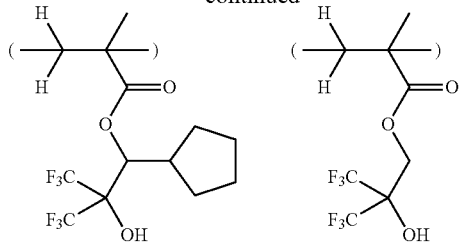

In a preferred embodiment, the polymer used as the base resin in the resist composition has further copolymerized therein units selected from sulfonium salts (d1) or (d2) represented by the general formulae below.

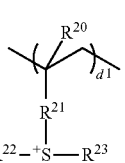
(d1)

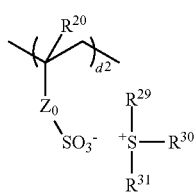
(d2)

Herein $R^{20}$ and $R^{28}$ each are hydrogen or methyl. $R^{21}$ is a single bond, phenylene, —O—$R^{33}$—, or —C(=O)—Y—$R^{33}$— wherein Y is oxygen or NH, and $R^{33}$ is a straight, branched or cyclic $C_1$-$C_6$, alkylene group, alkenylene or phenylene group, which may contain a carbonyl (—CO—), ester (—COO—), ether (—O—) or hydroxyl radical. $R^{22}$, $R^{23}$, $R^{29}$, $R^{30}$, and $R^{31}$ are each independently a $C_6$-$C_{12}$ aryl group in which at least one hydrogen atom may be replaced by a straight, branched or cyclic $C_1$-$C_5$, alkyl or alkoxy radical, halogen, trifluoromethyl or the like, and these rings may be bonded directly or via methylene, oxygen, carbonyl, sulfonyl, sulfone or the like. $Z_0$ is a single bond, methylene, ethylene, phenylene, fluorophenylene, or —C(=O)—$Z_1$—$R^{32}$— wherein $Z_1$ is oxygen or NH, and $R^{32}$ is a straight, branched or cyclic $C_1$-$C_6$ alkylene group, alkenylene or phenylene group, which may contain a carbonyl, ester, ether or hydroxyl radical. $M^-$ is a non-nucleophilic counter ion.

The polymer used herein may further comprise recurring units derived from monomers having a carbon-carbon double bond other than the above-described ones, for example, substituted acrylic acid esters such as methyl methacrylate, methyl crotonate, dimethyl maleate and dimethyl itaconate, unsaturated carboxylic acids such as maleic acid, fumaric acid, and itaconic acid, cyclic olefins such as norbornene, norbornene derivatives, and tetracyclo[$6.2.1.1^{3,6}.0^{2,7}$] dodecene derivatives, unsaturated acid anhydrides such as itaconic anhydride, and other monomers. As the hydrogenated ROMP polymer, those described in JP-A 2003-66612 may be used.

The polymer used herein generally has a weight average molecular weight (Mw) of 1,000 to 500,000, and preferably 3,000 to 100,000, as measured by GPC using polystyrene standards. Outside the range, there may result an extreme drop of etch resistance, and a drop of resolution due to difficulty to gain a dissolution rate difference before and after exposure.

In the polymer (C), appropriate molar fractions (mol %) of the respective recurring units derived from the monomers are given below although the invention is not limited thereto. The polymer may contain:

(I) constituent units of one or more types having formula (3) in a proportion of 1 mol % to 50 mol %, preferably 5 to 40 mol %, and more preferably 10 to 30 mol %, (II) constituent units of one or more types having formulas (4) to (6) in a proportion of 50 to 99 mol %, preferably 60 to 95 mol %, and more preferably 70 to 90 mol %, (III) constituent units of one or more types having formulas (d1) and (d2) in a proportion of 0 to 30 mol %, preferably 0 to 20 mol %, and more preferably 0 to 10 mol %, and (IV) constituent units of one or more types derived from other monomers in a proportion of 0 to 80 mol %, preferably 0 to 70 mol %, and more preferably 0 to 50 mol %, based on the total moles of constituent units.

In the embodiment wherein recurring units of formula (7) are incorporated in the polymer as the PAG of formula (1-3), the polymer preferably comprises 1 to 50 mol %, more preferably 5 to 40 mol %, and even more preferably 10 to 30 mol % of recurring units having formula (3), 48.2 to 98.8 mol %, more preferably 59.5 to 94.5 mol %, and even more preferably 69.5 to 89.5 mol % of recurring units of one or more type selected from formulae (4) to (6), and 0.2 to 20 mol %, more preferably 0.5 to 15 mol % of recurring units having formula (7).

The polymers may be used alone or in admixture of two or more. The performance of a resist composition may be adjusted by using two or more polymers.

The organic solvent (D) used herein may be any organic solvent in which the base resin, acid generator, carboxylic acid sulfonium salt, and other components are soluble. Illustrative, non-limiting, examples of the organic solvent include ketones such as cyclohexanone and methyl amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, propylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in combinations of two or more. Of the above organic solvents, it is recommended to use 1-ethoxy-2-propanol, PGMEA, cyclohexanone, γ-butyrolactone, and mixtures thereof because the acid generator is most soluble therein.

An appropriate amount of the organic solvent used is 200 to 5,000 parts, more preferably 400 to 3,000 parts by weight per 100 parts by weight of the base resin.

The resist composition may further comprise one or more of the following components: (E) a quencher, (S) a surfactant which is insoluble or substantially insoluble in water and soluble in alkaline developer, and/or a surfactant which is insoluble or substantially insoluble in water and alkaline developer (hydrophobic resin), and (F) an organic acid derivative and/or fluorinated alcohol. With respect to the quencher (E), the surfactant (S), PAG other than the PAG defined herein, and (F) the organic acid derivative and/or fluorinated alcohol, reference may be made to US 20090274978 (JP-A 2009-269953) and JP-A 2010-215608.

In addition to the PAG of formula (1-2), another PAG may be added. The other PAG may be any compound capable of generating an acid upon exposure to high-energy radiation including UV, DUV, EB, EUV, x-ray, excimer laser, γ-ray, and synchrotron radiation. Suitable PAGs include sulfonium salts, iodonium salts, sulfonyldiazomethane, N-sulfonyloxydicarboxylmide, O-arylsulfonyloxime, and O-alkylsulfonyloxime generators. The other acid generators may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include those sulfonium cations described in conjunction with formula (1-2). Exemplary sulfonates include trifluoromethanesulfonate, pentafluoroethanesulfonate, heptafluoropropanesulfonate, nonafluorobutanesulfonate, tridecafluorohexanesulfonate, 2,2,2-trifluoroethanesulfonate, pentafluorobenzenesulfonate, 1,1-difluoro-2-naphthylethanesulfonate, 1,1,2,2-tetrafluoro-2-(norbornan-2-yl)ethanesulfonate, 1,1,2,2-tetrafluoro-2-(tetracyclo[6.2.1.1$^{3,6}$.0$^{2,7}$]dodec-3-en-8-yl)ethanesulfonate, 2-benzoyloxy-1,1,3,3-pentafluoropropanesulfonate, 1,1-difluoro-2-tosyloxyethanesulfonate, adamantanemethoxycarbonyldifluoromethanesulfonate, 1-(3-hydroxymethyladamantane)methoxycarbonyldifluoromethanesulfonate, methoxycarbonyldifluoromethanesulfonate, 1-(hexahydro-2-oxo-3,5-methano-2H-cyclopenta[b]furan-6-yl-oxycarbonyl)difluoromethanesulfonate, and 4-oxo-1-adamantyloxycarbonyldifluoromethanesulfonate.

Exemplary bis(substituted alkylsulfonyl)imides include bis(trifluoromethylsulfonyl)imide, bis(pentafluoroethylsulfonyl)imide, bis(heptafluoropropylsulfonyl)imide, and perfluoro(1,3-propylenebissulfonyl)imide. A typical tris(substituted alkylsulfonyl)methide is tris(trifluoromethylsulfonyl)methide. Sulfonium salts based on combination of the foregoing examples are included.

Examples of the iodonium salt, N-sulfonyloxydicarboxylmide, O-arylsulfonyloxime, and O-alkylsulfonyloxime acid generators are described in JP-A 2009-269953.

Preferred examples of the other PAG include triphenylsulfonium nonafluorobutanesulfonate, triphenylsulfonium bis(trifluoromethylsulfonyl)imide, triphenylsulfonium perfluoro(1,3-propylenebissulfonyl)imide, triphenylsulfonium tris(trifluoromethanesulfonyl)methide, N-nonafluorobutanesulfonyloxy-1,8-naphthalenedicarboxylmide, 2-(2,2,3,3,4,4-hexafluoro-1-(nonafluorobutylsulfonyloxy-imino)butyl)fluorene, and 2-(2,2,3,3,4,4,5,5-octafluoro-1-(nonafluorobutylsulfonyloxy-imino)pentyl)fluorene.

The amount of the other PAG added is not particularly limited as long as the benefits of the invention are not compromised. An appropriate amount of the other PAG added is 0 to 20 parts, more preferably 0.1 to 10 parts by weight per 100 parts by weight of the base resin. Too high a proportion of the other PAG may give rise to problems such as degraded resolution and foreign particles during development and resist film stripping. The other PAG may be used alone or in admixture of two or more. A total amount of the acid generator having formula (1-2) and the other acid generator is preferably 0.1 to 40 parts, more preferably 1 to 20 parts by weight per 100 parts by weight of the base resin.

The quencher (E) may be a compound capable of suppressing the rate of diffusion when the acid generated by the PAG diffuses within the resist film. The inclusion of quencher facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile. The inclusion of quencher is also effective for improving adhesion to the substrate.

Examples of suitable quenchers include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts. Of these, preferred are tertiary amines, amine oxides, benzimidazoles and anilines having a polar functional group such as ether, carbonyl, ester or alcohol.

Preferred tertiary amines include 2-morpholinoethyl esters of straight, branched or cyclic $C_2$-$C_{20}$ aliphatic carboxylic acids and trialkylamines having a straight, branched or cyclic $C_2$-$C_{10}$ alkyl moiety. Also included are substituted forms of these amines in which some carbon-bonded hydrogen atoms are replaced by hydroxyl groups. These amines may have an ether or ester linkage. Examples include 2-morpholinoethyl 2-methoxyacetate, 2-morpholinoethyl 2-(2-methoxyethoxy) acetate, 2-morpholinoethyl 2-[2-(2-methoxyethoxy)ethoxy] acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, 2-morpholinoethyl cyclohexanecarboxylate, 2-morpholinoethyl adamantanecarboxylate, 4-[2-[(2-methoxyethoxy)methoxy]ethyl]morpholine, 4-[2-[2-(2-methoxyethoxy)ethoxy]ethyl]morpholine, 4-[2-[2-(2-butoxyethoxy)ethoxy]ethyl]morpholine, tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, and tris(2-pivaloyloxyethyl)amine.

Preferred examples of the benzimidazoles include benzimidazole, 2-phenylbenzimidazole, 1-(2-acetoxyethoxy)benzimidazole, 1-[2-(methoxymethoxy)ethyl]benzimidazole, 1-[2-(methoxymethoxy)ethyl]-2-phenylbenzimidazole, and 1-(2-(2-(2-methoxyethoxy)ethoxy)ethyl)benzimidazole.

Preferred examples of the anilines include aniline, N-methylaniline, N-ethylaniline, N-propylaniline, N,N-dimethylaniline, N,N-bis(hydroxyethyl)aniline, 2-methylaniline, 3-methylaniline, 4-methylaniline, ethylaniline, propylaniline, dimethylaniline, 2,6-diisopropylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine.

Also included are primary or secondary amines protected with tert-butoxycarbonyl (tBOC). Those compounds described in JP-A 2007-298569 and JP-A 2010-20204 are also useful.

The quenchers may be used alone or in admixture of two or more. The quencher is preferably used in an amount of 0.001 to 8 parts, more preferably 0.01 to 4 parts by weight per 100 parts by weight of the base resin. Less than 0.001 part of the quencher may achieve no addition effect whereas more than 8 parts may lead to too low a sensitivity.

To the resist composition, the surfactant (S) may be added. Reference should be made to those compounds defined as component (S) in JP-A 2010-215608 and JP-A 2011-16746.

While many examples of the surfactant which is insoluble or substantially insoluble in water and alkaline developer are described in these patent documents, preferred examples are FC-4430, Surflon S-381, Surfynol E1004, KH-20 and KH-30, which may be used alone or in admixture. Partially fluorinated oxetane ring-opened polymers having the structural formula (surf-1) are also useful.

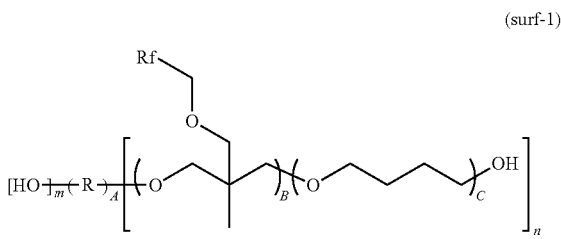

(surf-1)

It is provided herein that R, Rf, A, B, C, m, and n are applied to only formula (surf-1), independent of their descriptions other than for the surfactant. R is a di- to tetra-valent $C_2$-$C_5$ aliphatic group. Exemplary divalent groups include ethylene, 1,4-butylene, 1,2-propylene, 2,2-dimethyl-1,3-propylene and 1,5-pentylene. Exemplary tri- and tetra-valent groups are shown below.

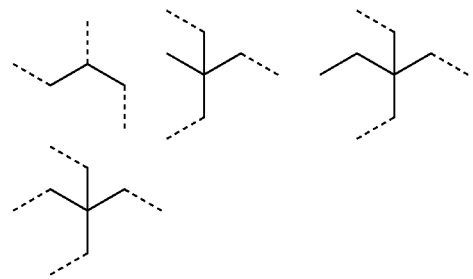

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl, and preferably trifluoromethyl. The letter m is an integer of 0 to 3, n is an integer of 1 to 4, and the sum of m and n, which represents the valence of R, is an integer of 2 to 4. A is equal to 1, B is an integer of 2 to 25, and C is an integer of 0 to 10. Preferably, B is an integer of 4 to 20, and C is 0 or 1. Note that the above structural formula does not prescribe the arrangement of respective constituent units while they may be arranged either in blocks or randomly. For the preparation of surfactants in the form of partially fluorinated oxetane ring-opened polymers, reference should be made to U.S. Pat. No. 5,650,483, for example.

The surfactant which is insoluble or substantially insoluble in water and soluble in alkaline developer is useful when ArF immersion lithography is applied to the resist composition in the absence of a resist protective film. In this embodiment, the surfactant has a propensity to segregate on the resist surface after spin coating for achieving a function of minimizing water penetration or leaching. The surfactant is also effective for preventing water-soluble components from being leached out of the resist film for minimizing any damage to the exposure tool. The surfactant becomes solubilized during alkaline development following exposure and PEB, and thus forms few or no foreign particles which become defects. The preferred surfactant is a polymeric surfactant which is insoluble or substantially insoluble in water, but soluble in alkaline developer, also referred to as "hydrophobic resin" in this sense, and especially which is water repellent and enhances water slippage. Suitable polymeric surfactants are shown below.

carbon atoms, typically 3H-perfluoropropyl, 4H-perfluorobutyl, 5H-perfluoropentyl, or 6H-perfluorohexyl. $X^2$ is each independently —C(=O)—O—, —O—, or —C(=O)—$R^{123}$—C(=O)—O—. $R^{123}$ is a straight, branched or cyclic $C_1$-$C_{10}$ alkylene group. The subscripts are in the range: $0 \leq (a'-1) < 1$, $0 \leq (a'-2) < 1$, $0 \leq (a'-3) < 1$, $0 \leq (a'-1)+(a'-2)+(a'-3) < 1$, $0 \leq b' < 1$, $0 \leq c' < 1$, and $0 < (a'-1)+(a'-2)+(a'-3)+b'+c' \leq 1$.

Examples of these units are shown below.

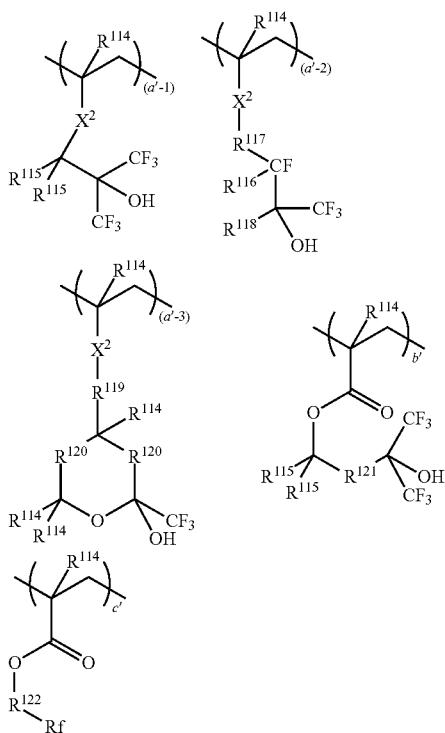

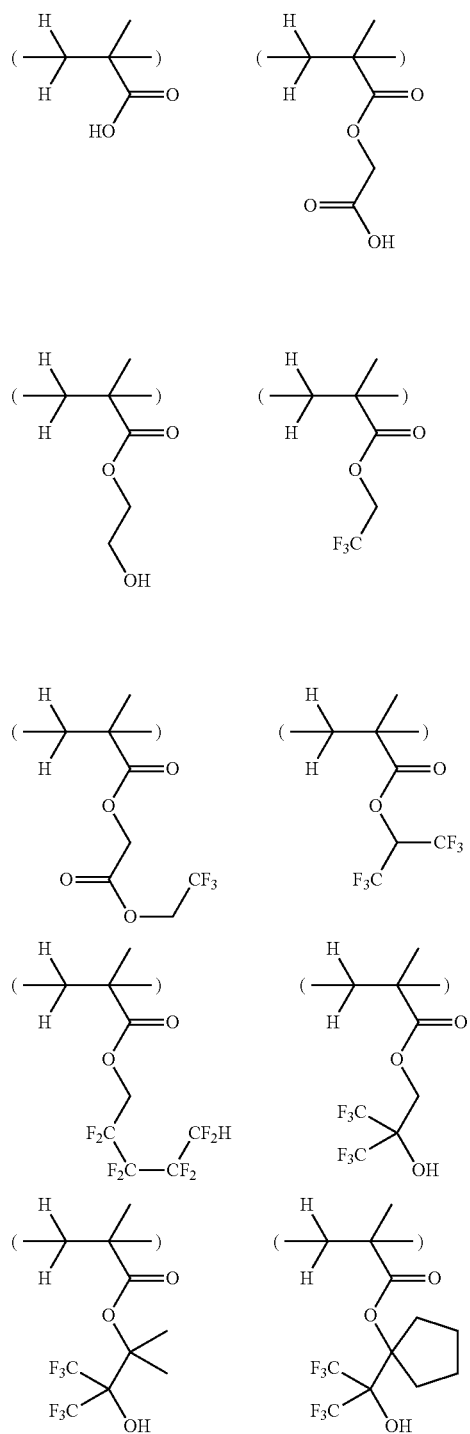

Herein $R^{114}$ is each independently hydrogen, fluorine, methyl or trifluoromethyl. $R^{115}$ is each independently hydrogen or a straight, branched or cyclic $C_1$-$C_{20}$ alkyl or fluoroalkyl group, or two $R^{115}$ in a common monomer may bond together to form a ring with the carbon atom to which they are attached, and in this event, they together represent a straight, branched or cyclic $C_2$-$C_{20}$ alkylene or fluoroalkylene group. $R^{116}$ is fluorine or hydrogen, or $R^{116}$ may bond with $R^{117}$ to form a non-aromatic ring of 3 to 10 carbon atoms in total with the carbon atom to which they are attached. $R^{117}$ is a straight, branched or cyclic $C_1$-$C_6$ alkylene group in which at least one hydrogen atom may be substituted by a fluorine atom. $R^{118}$ is a straight or branched $C_1$-$C_{10}$ alkyl group in which at least one hydrogen atom is substituted by a fluorine atom. Alternatively, $R^{117}$ and $R^{118}$ may bond together to form a non-aromatic ring with the carbon atoms to which they are attached. In this event, $R^{117}$, $R^{118}$ and the carbon atoms to which they are attached together represent a trivalent organic group of 2 to 12 carbon atoms in total. $R^{119}$ is a single bond or a $C_1$-$C_4$ alkylene. $R^{120}$ is each independently a single bond, —O—, or —$CR^{114}R^{114}$—. $R^{121}$ is a straight or branched $C_1$-$C_4$ alkylene group, or may bond with $R^{115}$ within a common monomer to form a $C_3$-$C_6$ non-aromatic ring with the carbon atom to which they are attached. $R^{122}$ is 1,2-ethylene, 1,3-propylene, or 1,4-butylene. Rf is a linear perfluoroalkyl group of 3 to 6

-continued
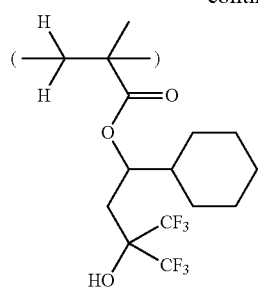 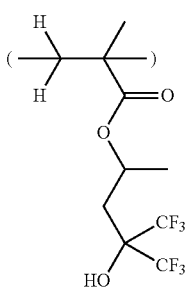 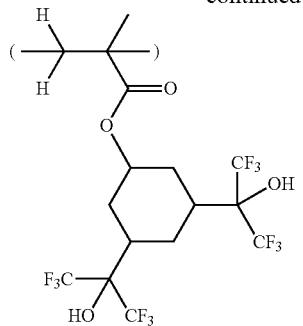
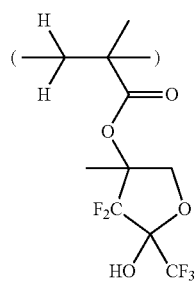 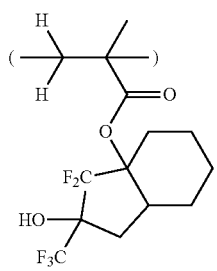 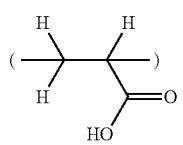 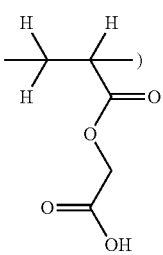
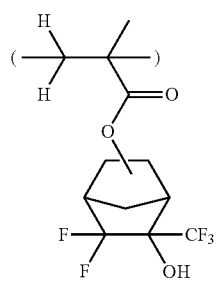 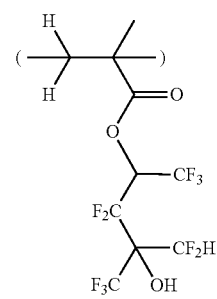 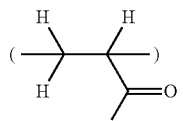 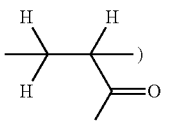
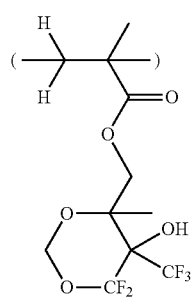 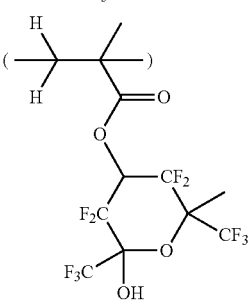 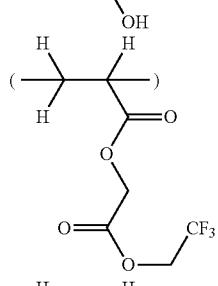 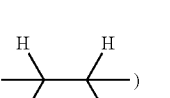
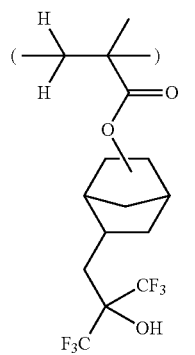 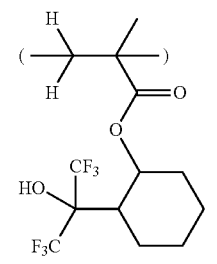 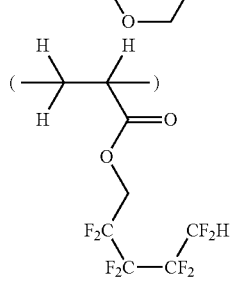 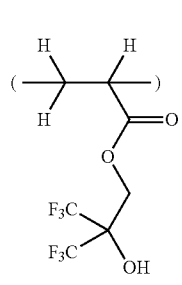
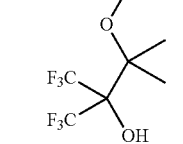 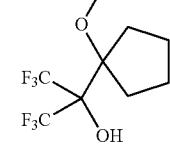

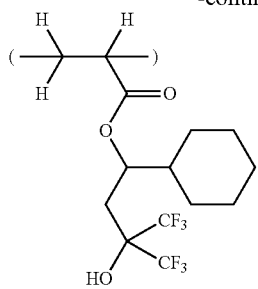 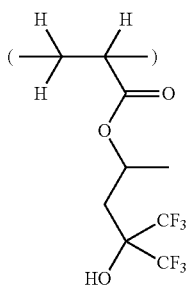 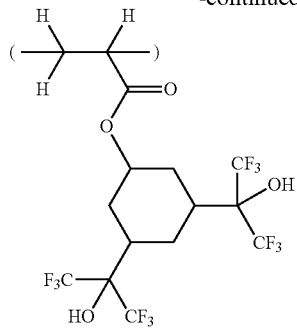

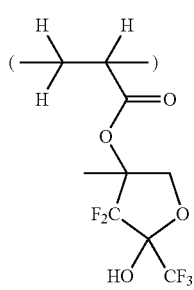 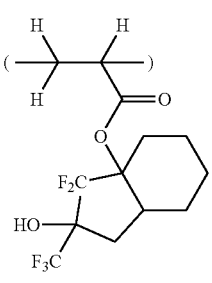

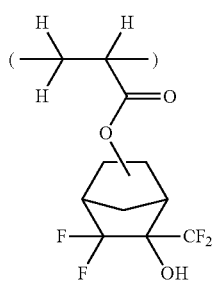 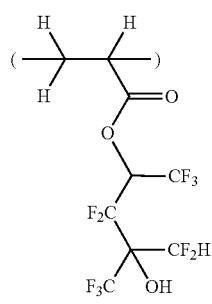

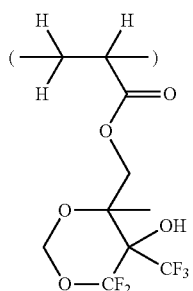 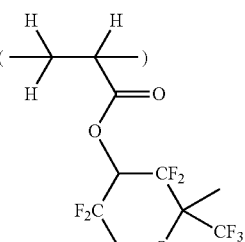

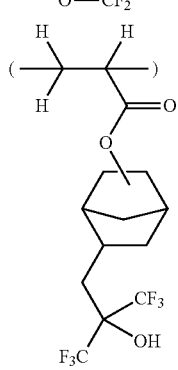 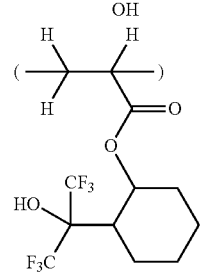

For the surfactant which is insoluble or substantially insoluble in water and soluble in alkaline developer, reference may be made to JP-A 2008-122932, 2010-134012, 2010-107695, 2009-276363, 2009-192784, 2009-191151, 2009-98638, 2010-250105, and 2011-42789.

The polymeric surfactant preferably has a Mw of 1,000 to 50,000, more preferably 2,000 to 20,000 as measured by GPC versus polystyrene standards. A surfactant with a Mw outside the range may be less effective for surface modification and cause development defects. The polymeric surfactant is preferably formulated in an amount of 0.001 to 20 parts, and more preferably 0.01 to 10 parts by weight per 100 parts by weight of the base resin. Reference should also be made to JP-A 2010-215608.

To the resist composition, a compound which is decomposed with an acid to generate another acid, that is, acid amplifier compound may be added. For these compounds, reference should be made to JP-A 2009-269953 and 2010-215608. In the resist composition, an appropriate amount of the acid amplifier compound is up to 2 parts, and especially up to 1 part by weight per 100 parts by weight of the base resin. Excessive amounts of the acid amplifier compound make diffusion control difficult, leading to degradation of resolution and pattern profile.

Optionally, an organic acid derivative or a compound having a Mw of up to 3,000 which changes its solubility in alkaline developer under the action of an acid, also referred to as dissolution inhibitor, may be added. Reference may be made to JP-A 2009-269953 and 2010-215608.

Process

A further embodiment of the invention is a pattern forming process using the resist composition defined above. A pattern may be formed from the resist composition using any well-known lithography process. The preferred process includes at least the steps of forming a resist film on a substrate, exposing it to high-energy radiation, and developing it in a developer.

The resist composition is applied onto a substrate for integrated circuit fabrication (e.g., Si, $SiO_2$, SiN, SiON, TiN, WSi, BPSG, SOG or organic antireflective coating) by a suitable coating technique such as spin coating. The coating is prebaked on a hot plate at a temperature of 60 to 150° C. for 1 to 10 minutes, preferably 80 to 140° C. for 1 to 5 minutes, to form a resist film of 0.05 to 2.0 μm thick. The resist film is then exposed by the ArF immersion lithography. A mask having the desired pattern is placed over the resist film, a liquid, typically water, is interposed between the mask and the resist film, and the resist film is exposed to ArF excimer laser radiation in a dose of 1 to 200 $mJ/cm^2$, and preferably 10 to 100 $mJ/cm^2$. Prior to exposure, a protective film which is insoluble in water may be formed on the resist film, if desired.

After exposure, the resist film is baked (PEB) on a hot plate at 60 to 150° C. for 1 to 5 minutes, and preferably at 80 to 140°

C. for 1 to 3 minutes. This is followed by development in a developer which is an alkaline aqueous solution, typically an aqueous solution of 0.1 to 5 wt %, more typically 2 to 3 wt % of tetramethylammonium hydroxide (TMAH). Development may be carried out by a conventional method such as dip, puddle, or spray development for 0.1 to 3 minutes, and preferably 0.5 to 2 minutes. These steps result in the formation of the desired pattern on the substrate.

The water-insoluble protective film which is used in the immersion lithography is to prevent any components from being leached out of the resist film and to improve water slippage at the film surface and is generally divided into two types. The first type is an organic solvent-strippable protective film which must be stripped, prior to alkaline development, with an organic solvent in which the resist film is not dissolvable. The second type is an alkali-soluble protective film which is soluble in an alkaline developer so that it can be removed simultaneously with the removal of solubilized regions of the resist film. The protective film of the second type is preferably of a material comprising a polymer having a 1,1,1,3,3,3-hexafluoro-2-propanol residue (which is insoluble in water and soluble in an alkaline developer) as a base in an alcohol solvent of at least 4 carbon atoms, an ether solvent of 8 to 12 carbon atoms or a mixture thereof. Alternatively, the aforementioned surfactant which is insoluble in water and soluble in an alkaline developer may be dissolved in an alcohol solvent of at least 4 carbon atoms, an ether solvent of 8 to 12 carbon atoms or a mixture thereof to form a material from which the protective film of the second type is formed.

Any desired step may be added to the pattern forming process. For example, after a photoresist film is formed, a step of rinsing with pure water (post-soaking) may be introduced to extract the acid generator or the like from the film surface or wash away particles. After exposure, a step of rinsing (post-soaking) may be introduced to remove any water remaining on the film after exposure.

The technique enabling the ArF lithography to survive to the 32-nm node is a double patterning process. The double patterning process includes a trench process of processing an underlay to a 1:3 trench pattern by a first step of exposure and etching, shifting the position, and forming a 1:3 trench pattern by a second step of exposure for forming a 1:1 pattern; and a line process of processing a first underlay to a 1:3 isolated left pattern by a first step of exposure and etching, shifting the position, processing a second underlay formed below the first underlay by a second step of exposure through the 1:3 isolated left pattern, for forming a half-pitch 1:1 pattern.

In the pattern forming process, an alkaline aqueous solution, typically an aqueous solution of 0.1 to 5 wt %, more typically 2 to 3 wt % of tetramethylammonium hydroxide (TMAH) is often used as the developer. The negative tone development technique wherein the unexposed region is developed and dissolved in an organic solvent is also applicable.

In the organic solvent development, the organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

EXAMPLE

Examples of the invention are given below by way of illustration and not by way of limitation. Mw and Mn are weight and number average molecular weights, respectively, as measured by GPC versus polystyrene standards, and Mw/Mn is a polydispersity index. Me stands for methyl.

Synthesis Example 1

Synthesis of triphenylsulfonium 2,3,3,3-tetrafluoro-2-(1,1,2,2,3,3,3-heptafluoropropoxy)propionate (PAG-1)

To 6.6 g (0.02 mol) of 2,3,3,3-tetrafluoro-2-(1,1,2,2,3,3,3-heptafluoropropoxy)propionic acid were added an amount (0.03 mol) of triphenylsulfonium chloride aqueous solution, 60 g of methyl isobutyl ketone, and 25 g of dichloromethane. An organic layer was taken out, and washed with 50 g of water three times. After the solvent was distilled off in vacuum, the residue was added to diisopropyl ether for crystallization. On filtration and drying, 4.2 g of white crystals was obtained (yield 35%). The compound thus obtained was analyzed by spectroscopy.

IR (cm$^{-1}$): 3471, 1705, 1477, 1449, 1375, 1300, 1233, 1194, 1142, 1075, 1029, 998, 987, 797, 749, 720, 683

$^1$H-NMR (500 MHz in CDCl$_3$): δ=7.6-7.8 (15H, m) ppm $^{19}$F-NMR (470 MHz in CDCl$_3$): FIG. 1

Synthesis Example 2

Synthesis of 4-tert-butylphenyldiphenylsulfonium 2,3,3,3-tetrafluoro-2-(1,1,2,2,3,3,3-heptafluoropropoxy)-propionate (PAG-2)

Synthesis was carried out as in Synthesis Example 1 aside from using 13.2 g (0.04 mol) of 2,3,3,3-tetrafluoro-2-(1,1,2,2,3,3,3-heptafluoropropoxy)propionic acid and an amount (0.06 mol) of 4-tert-butylphenyldiphenylsulfonium bromide aqueous solution. There was obtained 9.5 g of white crystals (yield 37%). The compound thus obtained was analyzed by spectroscopy.

IR (cm$^{-1}$): 3410, 3059, 2962, 2869, 2659, 1621, 1477, 1446, 1382, 1268, 1072, 997, 836, 750, 686

$^1$H-NMR (500 MHz in CDCl$_3$): δ=1.3 (9H, s), 7.5-7.6 (8H, m), 7.7-7.9 (6H, m) ppm Preparation of Resist Examples 1-1 to 1-6 and Comparative Examples 1-1 to 1-3

A resist solution was prepared by combining a PAG in Synthesis Example, Polymer A, B or C as base resin, additive and solvent in accordance with the formulation shown in Table 1, dissolving the components, and filtering through a Teflon® filter having a pore size of 0.2 µm. The solvent contained 0.01 wt % of surfactant A.

The solvent, quencher, PAG, and alkali soluble surfactant (SF-1) in Table 1 are identified below.
P-A:
Polymer A
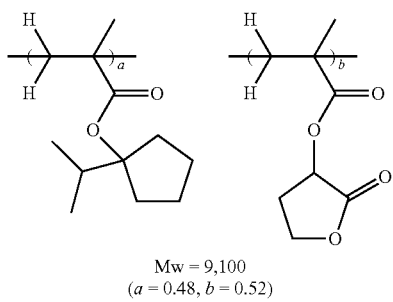
Mw = 9,100
(a = 0.48, b = 0.52)
P-B:
Polymer B
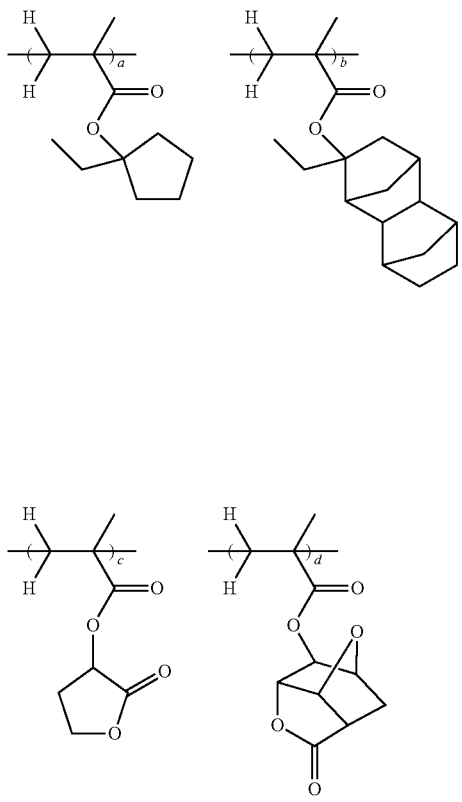
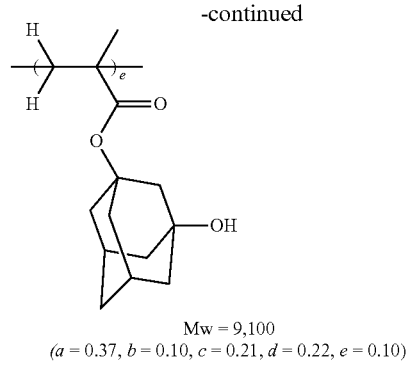
Mw = 9,100
(a = 0.37, b = 0.10, c = 0.21, d = 0.22, e = 0.10)
P-C:
Polymer C
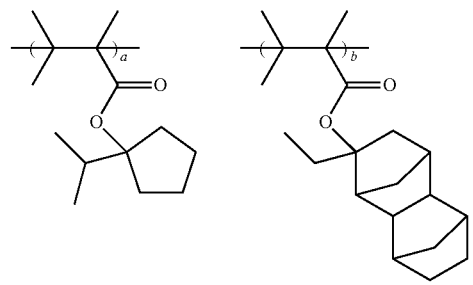
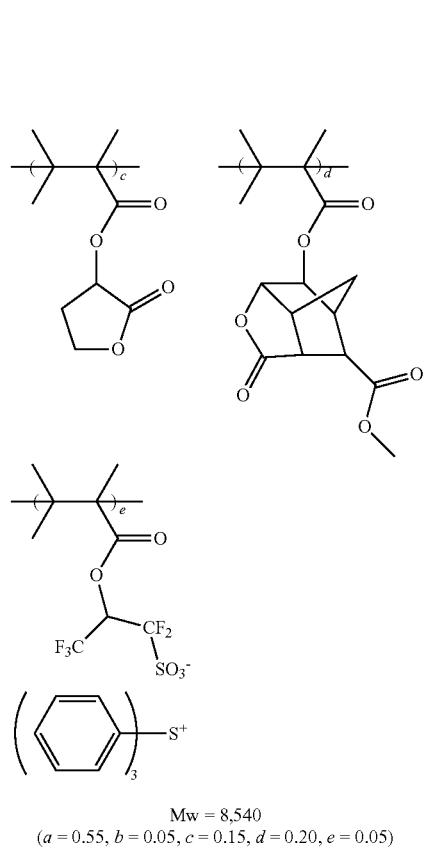
Mw = 8,540
(a = 0.55, b = 0.05, c = 0.15, d = 0.20, e = 0.05)

PAG-1, PAG-2: as synthesized above

PGMEA: propylene glycol monomethyl ether acetate

GBL: γ-butyrolactone

CyHO: cyclohexanone

PAG-A: triphenylsulfonium 2-(adamantane-1-carbonyloxy)-1,1,3,3,3-pentafluoropropane-1-sulfonate PAG-B: 4-tert-butylphenyldiphenylsulfonium 2-(adamantane-1-carbonyloxy)-1,1,3,3,3-pentafluoropropane-1-sulfonate PAG-C: 4-tert-butylphenyldiphenylsulfonium 2-(4-oxoadamantane-1-carbonyloxy)-1,1-difluoroethanesulfonate PAG-X: triphenylsulfonium nonafluoro-1-butansulfonate PAG-Y: triphenylsulfonium 10-camphorsulfonate PAG-Z: triphenylsulfonium heptafluoro-1-propionate BASE-1: 2,6-diisopropylaniline SF-1: Polymer 1 (described in JP-A 2008-122932) poly(3,3,3-trifluoro-2-hydroxy-1,1-dimethyl-2-trifluoromethyl-propyl methacrylate/1,1,1-trifluoro-2-hydroxy-6-methyl-2-trifluoro-methylhept-4-yl methacrylate)

Mw=7,300
Mw/Mn=1.86

Polymer 1

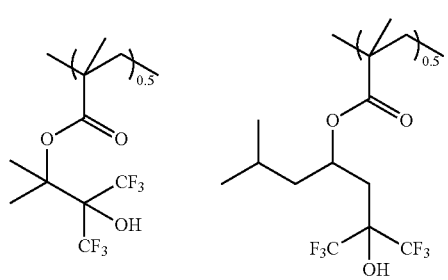

Surfactant A: 3-methyl-3-(2,2,2-trifluoroethoxymethyl)-oxetane/tetrahydrofuran/2,2-dimethyl-1,3-propane diol copolymer (Omnova Solutions, Inc.) of the structural formula shown below.

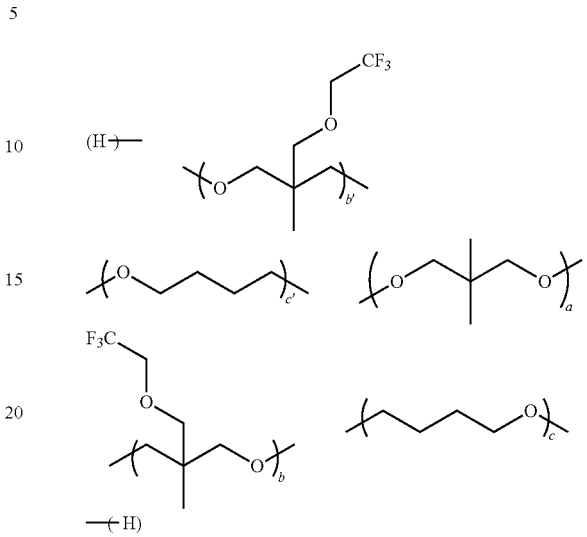

a:(b+b'):(c+c')=1:4-7:0.01-1 (molar ratio)
Mw=1,500

TABLE 1

|  |  | Resist material | Resin (pbw) | PAG (pbw) | PAG (pbw) | Additive (pbw) | Solvent 1 (pbw) | Solvent 2 (pbw) |
|---|---|---|---|---|---|---|---|---|
| Example | 1-1 | R-01 | P-A (80) | PAG-A (6.34) | PAG-1 (4.60) | SF-1 (5.0) | PGMEA (1,728) | GBL (192) |
|  | 1-2 | R-02 | P-A (80) | PAG-B (6.88) | PAG-1 (4.60) | SF-1 (5.0) BASE-1 (0.15) | PGMEA (1,728) | GBL (192) |
|  | 1-3 | R-03 | P-A (80) | PAG-B (6.88) | PAG-1 (4.60) | SF-1 (5.0) | PGMEA (1,728) | GBL (192) |
|  | 1-4 | R-04 | P-B (80) | PAG-B (6.88) | PAG-1 (4.60) | SF-1 (5.0) | PGMEA (1,728) | GBL (192) |
|  | 1-5 | R-05 | P-B (80) | PAG-C (6.36) | PAG-2 (5.03) | SF-1 (5.0) | PGMEA (1,728) | GBL (192) |
|  | 1-6 | R-06 | P-C (80) | — | PAG-2 (5.03) | SF-1 (5.0) | PGMEA (1,344) | CyHO (576) |
| Comparative Example | 1-1 | R-101 | P-A (80) | PAG-A (6.34) | PAG-Y (3.84) | SF-1 (5.0) | PGMEA (1,728) | GBL (192) |
|  | 1-2 | R-102 | P-B (80) | PAG-A (6.34) | PAG-Z (3.70) | SF-1 (5.0) | PGMEA (1,728) | GBL (192) |
|  | 1-3 | R-103 | P-A (80) | PAG-X (5.45) | PAG-1 (4.60) | SF-1 (5.0) | PGMEA (1,728) | GBL (192) |

Resist Evaluation

Examples 2-1 to 2-6 and Comparative Examples 2-1 to 2-3

An antireflective coating solution (ARC-29A by Nissan Chemical Industries, Ltd.) was coated onto a silicon substrate and baked at 200° C. for 60 seconds to form an ARC film of 100 nm thick. The resist solution was spin coated onto the ARC and baked on a hot plate at 100° C. for 60 seconds to form a resist film of 90 nm thick. The resist film was exposed according to the ArF immersion lithography using an ArF excimer laser scanner (model NSR-S610C, Nikon Corp., NA 1.30, dipole illumination, 6% halftone phase shift mask). The resist film was baked (PEB) at an arbitrary temperature for 60 seconds and developed in a 2.38 wt % tetramethylammonium hydroxide aqueous solution for 60 seconds.

Evaluation Method

The resist was evaluated by observing a 40-nm 1:1 line-and-space pattern under an electron microscope. The optimum dose (Eop) was a dose (mJ/cm$^2$) which provided a line width of 40 nm. The profile of a pattern at the optimum dose was compared and judged passed or rejected according to the following criterion.

Passed: pattern of rectangular profile with perpendicular sidewall
  Rejected: pattern of tapered profile with sharply graded sidewall or of top-rounded profile due to top loss The width of lines of a 40-nm 1:1 line-and-space pattern was measured under SEM to determine a line width variation (30 points measured, 3σ value computed), which was reported as line width roughness (LWR). A smaller value of LWR indicates a line pattern with a less fluctuation and of better profile. In this test, the sample was rated good when LWR is equal to or less than 3.0 nm and poor when LWR is equal to or more than 3.1 nm.

The collapse limit was a minimum width (nm) of lines which could be resolved without collapse when the line width was reduced by increasing the exposure dose. A smaller value indicates better collapse resistance. In this test, the sample was rated good when the collapse limit is equal to or less than 33 nm and poor when the collapse limit is equal to or more than 34 nm.

Defects in the pattern as developed were inspected by a flaw detector KLA2800 (KLA-Tencor). A defect density (count/cm$^2$) was computed by dividing the total number of detected defects by a detection area. The pattern formed was an iterated 40-nm 1:1 line-and-space pattern. The defect inspection conditions included light source UV, inspected pixel size 0.28 μm, and cell-to-cell mode. In this test, the sample was rated good for a defect density of less than 0.05 defect/cm$^2$ and poor for a density of equal to or more than 0.05 defect/cm$^2$.

The test results of the resist materials are shown in Table 2 together with the PEB temperature.

TABLE 2

|  |  | Resist | PEB temp. (° C.) | Eop (mJ/cm$^2$) | Profile | LER (nm) | Collapse limit (nm) | Defect density (count/cm$^2$) |
| --- | --- | --- | --- | --- | --- | --- | --- | --- |
| Example | 2-1 | R-01 | 80 | 35 | Passed | Good 2.8 | Good 32 | Good 0.02 |
|  | 2-2 | R-02 | 80 | 42 | Passed | Good 3.0 | Good 29 | Good 0.03 |
|  | 2-3 | R-03 | 80 | 42 | Passed | Good 2.9 | Good 31 | Good 0.03 |
|  | 2-4 | R-04 | 95 | 45 | Passed | Good 2.8 | Good 32 | Good 0.04 |
|  | 2-5 | R-05 | 95 | 49 | Passed | Good 2.8 | Good 32 | Good 0.03 |
|  | 2-6 | R-06 | 85 | 36 | Passed | Good 2.7 | Good 32 | Good 0.03 |
| Comparative Example | 2-1 | R-101 | 80 | 26 | Passed | Poor 3.3 | Poor 36 | Poor 0.20 |
|  | 2-2 | R-102 | 95 | 30 | Passed | Poor 3.3 | Poor 34 | Poor 0.08 |
|  | 2-3 | R-103 | 80 | 28 | Rejected | Poor 3.7 | Good 31 | Good 0.03 |

It is evident from the data of Table 2 that the resist compositions comprising specific sulfonium salts form patterns of good profile having a minimal LER, collapse resistance, and a low defect density.

Measurement of Leach-Out from Resist Film

Examples 3-1, 3-2, 4-1, 4-2 and Comparative Examples 3-1, 3-2, 4-1, 4-2

An amount of component leached out of resist film in immersion water was determined. Resist compositions (R-07 to 09) and comparative resist composition (R-104) were prepared as in Example 1, but in accordance with the formulation of Table 3. Each resist composition was spin coated onto a silicon substrate, baked at 100° C. for 60 seconds to form a photoresist film of 100 nm thick. In the test, the unexposed resist film was immersed in water because after exposure, no cations were detectable as a result of photo-reaction of PAG upon exposure.

TABLE 3

|  |  | Resist material | Resin (pbw) | PAG (pbw) | Additive 2 (pbw) | Solvent 1 (pbw) | Solvent 2 (pbw) |
| --- | --- | --- | --- | --- | --- | --- | --- |
| Example | 3-1 | R-07 | P-A (80) | PAG-1 (4.60) | SF-1 (5.0) | PGMEA (1,944) | GBL (216) |
|  | 3-2 | R-08 | P-A (80) | PAG-2 (5.14) | SF-1 (5.0) | PGMEA (1,944) | GBL (216) |
| Comparative Example | 3-1 | R-09 | P-A (80) | PAG-Y (4.80) | SF-1 (5.0) | PGMEA (1,944) | GBL (216) |
|  | 3-2 | R-104 | P-A (80) | PAG-Z (4.62) | SF-1 (5.0) | PGMEA (1,944) | GBL (216) |

Using WEXA-2 system (IMEC), the leaching solution was recovered from the resist film. Specifically, the resist film was chucked by vacuum suction to a stage provided with five slits of 5 mm deep and 50 mm long. Using a syringe pump (Harvard Apparatus), the leaching solution was recovered at a different flow volume and flow rate for each slit as shown in Table 4. The concentration of PAG cation in the leaching solution was quantitatively determined by LC-MS analyzer (Agilent Technologies).

TABLE 4

| Slit | Flow volume (ml) | Flow rate (ml/min) |
|---|---|---|
| 1 | 2.65 | 35 |
| 2 | 3.0 | 25 |
| 3 | 3.1 | 20 |
| 4 | 3.0 | 13 |
| 5 | 2.65 | 4 |

From the cation concentration measured for each slit and the immersion time, a relationship of the leach-out amount to the immersion time was approximated to the following equation:

Leach-out amount $Y = A \times B \times \exp(-Bt)$ wherein A is a saturation leach-out amount (mol/cm$^2$), B is a time constant (s$^{-1}$), and t is an immersion time (s), from which constants A and B were determined.

Table 5 shows the measurement results of initial cation dissolution rate: A×B (mol/cm$^2$*s) at t=0. With respect to the equation and computation method, reference should be made to Proc. SPIE, 6154, 186 (2006).

TABLE 5

| | Resist material | | Cation dissolution rate (mol/cm$^2$*s) |
|---|---|---|---|
| Example | 4-1 | R-07 | $2.6 \times 10^{-12}$ |
| | 4-2 | R-08 | $1.4 \times 10^{-13}$ |
| Comparative Example | 4-1 | R-09 | $5.4 \times 10^{-12}$ |
| | 4-2 | R-104 | $9.2 \times 10^{-13}$ |

It is seen from the data of Table 5 that the resist compositions within the scope of the invention are effective for preventing cations from being leached out during the immersion lithography using water. For the immersion lithography, little changes of the pattern profile and few damages to the exposure tool are expectable.

Japanese Patent Application No. 2011-234818 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A chemically amplified positive resist composition for ArF immersion lithography, comprising
   (A) a triarylsulfonium 2,3,3,3-tetrafluoro-2-(1,1,2,2,3,3,3-heptafluoropropoxy)propionate having the general formula (1-1):

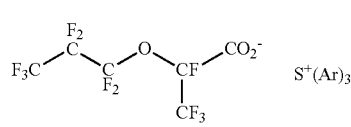

(1-1)

wherein Ar is a substituted or unsubstituted C$_6$-C$_{20}$ aryl group which may contain a heteroatom, or a plurality of Ar groups may bond together directly or via an oxygen atom, methylene, sulfone or carbonyl moiety, (B) one or more acid generator having the general formula (1-2):

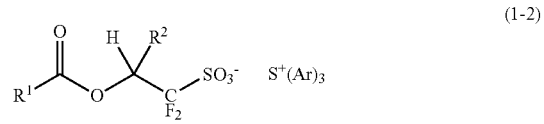

(1-2)

wherein R$^1$ is a C$_1$-C$_{30}$ alkyl, alkenyl or aralkyl group which may contain a heteroatom, R$^2$ is hydrogen or trifluoromethyl, and Ar is a substituted or unsubstituted C$_6$-C$_{20}$ aryl group which may contain a heteroatom, or a plurality of Ar groups may bond together directly or via an oxygen atom, methylene, sulfone or carbonyl moiety, (C) a base resin having an acidic functional group protected with an acid labile group, which is insoluble or substantially insoluble in alkaline developer, but turns soluble in alkaline developer upon deprotection of the acid labile group, and (D) an organic solvent.

2. The resist composition of claim 1 wherein the base resin (C) comprises recurring units having an acid labile group represented by the general formula (3) and recurring units of at least one type selected from the general formulae (4) to (6):

(3)

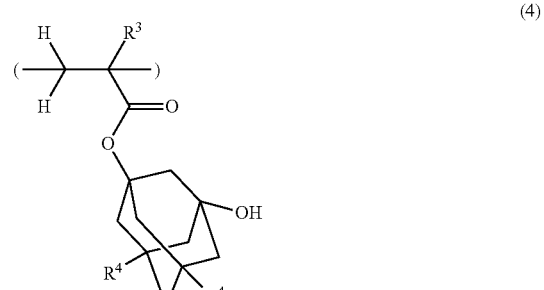

(4)

(5)

(6)

wherein R$^3$ is hydrogen, fluorine, methyl or trifluoromethyl, XA is an acid labile group, R$^4$ is each independently hydrogen or hydroxyl, YL is a substituent group having a lactone structure, ZA is hydrogen, a $C_1$-$C_{15}$ fluoroalkyl group or $C_1$-$C_{15}$ fluoroalcohol-containing substituent group.

3. A pattern forming process comprising the steps of applying the resist composition of claim 1 onto a substrate, prebaking to form a resist film, exposing the resist film to high-energy radiation through a photomask while interposing water between the substrate and a projection lens, optionally baking, and developing in a developer.

4. A chemically amplified positive resist composition for ArF immersion lithography, comprising (A) a triarylsulfonium 2,3,3,3-tetrafluoro-2-(1,1,2,2,3,3,3-heptafluoropropoxy)propionate having the general formula (1-1):

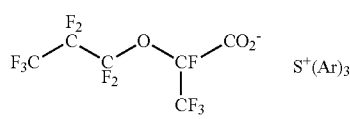
(1-1)

wherein Ar is a substituted or unsubstituted $C_6$-$C_{20}$ aryl group which may contain a heteroatom, or a plurality of Ar groups may bond together directly or via an oxygen atom, methylene, sulfone or carbonyl moiety, (B) one or more acid generator having the general formula (1-3):

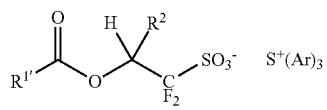
(1-3)

wherein $R^{1'}$ is a backbone of the base resin (C), $R^2$ is hydrogen or trifluoromethyl, and Ar is a substituted or unsubstituted $C_6$-$C_{20}$ aryl group which may contain a heteroatom, or a plurality of Ar groups may bond together directly or via an oxygen atom, methylene, sulfone or carbonyl moiety, (C) a base resin having an acidic functional group protected with an acid labile group, which is insoluble or substantially insoluble in alkaline developer, but turns soluble in alkaline developer upon deprotection of the acid labile group, and (D) an organic solvent.

5. The resist composition of claim 4 wherein components (B) and (C) are combined as a polymer comprising acid labile group-containing recurring units having the general formula (3), recurring units of at least one type selected from the general formulae (4) to (6), and recurring units having the general formula (7),

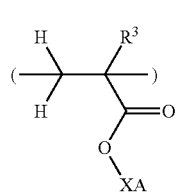
(3)

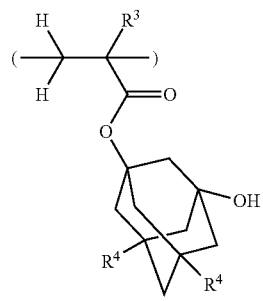
(4)

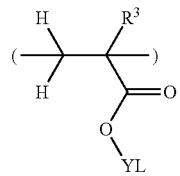
(5)

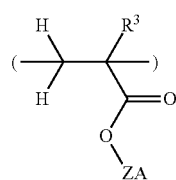
(6)

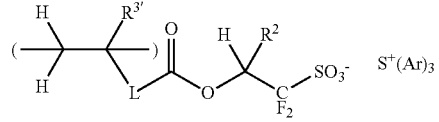
(7)

wherein $R^3$ is hydrogen, fluorine, methyl or trifluoromethyl, XA is an acid labile group, $R^4$ is each independently hydrogen or hydroxyl, YL is a substituent group having a lactone structure, ZA is hydrogen, a $C_1$-$C_{15}$ fluoroalkyl group or $C_1$-$C_{15}$ fluoroalcohol-containing substituent group, $R^{3'}$ is hydrogen or methyl, L is a single bond or a divalent hydrocarbon group which may contain an ether or ester bond, $R^2$ and Ar are as defined above.

6. The resist composition of claim 5 wherein the recurring unit having formula (7) is selected from the following recurring units:

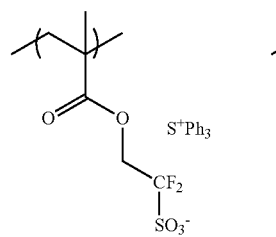

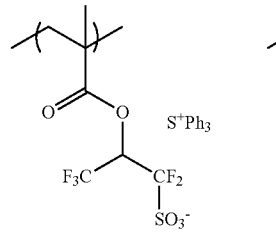

-continued
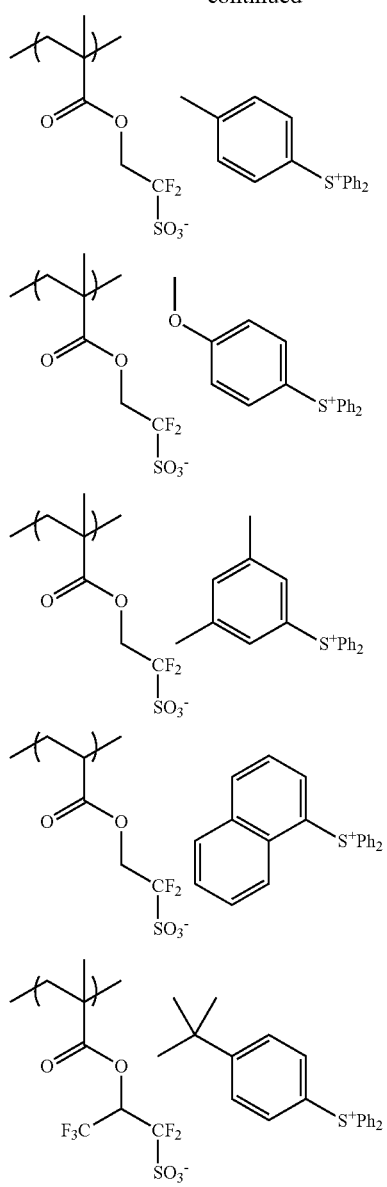
-continued
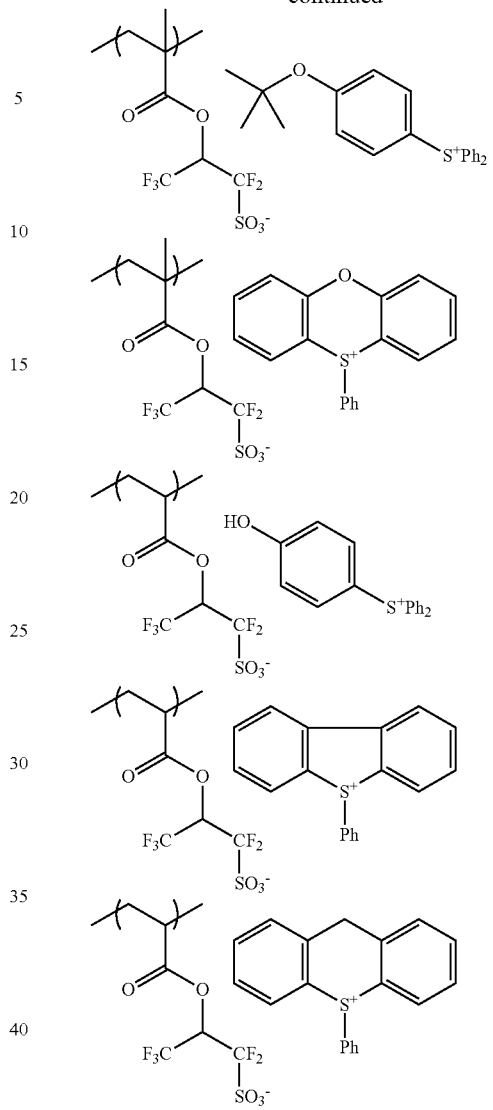
wherein Ph is phenyl.
* * * * *